United States Patent
Hidaka et al.

(10) Patent No.: US 8,384,875 B2
(45) Date of Patent: Feb. 26, 2013

(54) EXPOSURE APPARATUS, EXPOSURE METHOD, AND METHOD FOR PRODUCING DEVICE

(75) Inventors: Yasuhiro Hidaka, Kumagaya (JP); Tadashi Nagayama, Tokyo (JP); Tohru Kiuchi, Higashikurume (JP)

(73) Assignee: Nikon Corporation, Tokyo (JP)

( * ) Notice: Subject to any disclaimer, the term of this patent is extended or adjusted under 35 U.S.C. 154(b) by 582 days.

(21) Appl. No.: 12/461,508

(22) Filed: Aug. 13, 2009

(65) Prior Publication Data
US 2010/0079743 A1 Apr. 1, 2010

Related U.S. Application Data

(60) Provisional application No. 61/136,725, filed on Sep. 29, 2008.

(51) Int. Cl.
| | |
|---|---|
| G03B 27/44 | (2006.01) |
| G03B 27/42 | (2006.01) |
| G03B 27/70 | (2006.01) |
| G03B 27/32 | (2006.01) |
| G03B 27/54 | (2006.01) |
| G03B 27/72 | (2006.01) |

(52) U.S. Cl. .............. 355/46; 355/53; 355/66; 355/67; 355/71; 355/77

(58) Field of Classification Search ............... 355/46, 355/52, 53, 55, 66–71, 77; 430/5, 8, 22, 430/30, 311, 312
See application file for complete search history.

(56) References Cited

U.S. PATENT DOCUMENTS

| | | | |
|---|---|---|---|
| 5,493,403 A | 2/1996 | Nishi | |
| 5,526,093 A * | 6/1996 | Takahashi | 355/53 |
| 5,579,147 A * | 11/1996 | Mori et al. | 359/204.1 |
| 5,617,211 A * | 4/1997 | Nara et al. | 356/401 |
| 5,646,413 A | 7/1997 | Nishi | |
| 5,969,441 A | 10/1999 | Loopstra et al. | |
| 6,238,852 B1 * | 5/2001 | Klosner | 430/396 |

(Continued)

FOREIGN PATENT DOCUMENTS

| | | |
|---|---|---|
| EP | 1 420 298 A2 | 5/2004 |
| JP | A-04-065603 | 3/1992 |

(Continued)

OTHER PUBLICATIONS

International Search Report issued on Dec. 16, 2009 in International Patent Application No. PCT/JP2009/067200.

(Continued)

Primary Examiner — Toan Ton
Assistant Examiner — Christina Riddle
(74) Attorney, Agent, or Firm — Oliff & Berridge, PLC

(57) ABSTRACT

An exposure apparatus includes a mask-moving section movable in a first direction while holding a mask formed with a pattern; an illumination system which forms first and second illumination areas separated each other by a spacing distance in the first direction; a substrate-moving section movable in a second direction while holding a photosensitive substrate; a projection optical system which forms first and second projected images of the patterns of the first and second illumination areas; and a restricting section which restricts the first and second projected images to be within first and second projection areas respectively. A spacing distance between a first conjugate area with the first projection area and a second conjugate area with the second projection area is set to be such a spacing distance that scanning exposures are successively performed for first and second transfer areas provided adjacently in the second direction.

40 Claims, 25 Drawing Sheets

U.S. PATENT DOCUMENTS

| | | |
|---|---|---|
| 6,341,007 B1 | 1/2002 | Nishi et al. |
| 6,383,940 B1 * | 5/2002 | Yoshimura .................... 438/708 |
| 6,400,441 B1 | 6/2002 | Nishi et al. |
| 6,549,269 B1 | 4/2003 | Nish et al. |
| 6,590,634 B1 | 7/2003 | Nishi et al. |
| 6,897,963 B1 | 5/2005 | Taniguchi et al. |
| 6,952,253 B2 | 10/2005 | Lof et al. |
| 7,023,610 B2 | 4/2006 | Ohtsuki et al. |
| 2002/0123012 A1 * | 9/2002 | Sewell ......................... 430/397 |
| 2004/0165159 A1 | 8/2004 | Lof et al. |
| 2005/0280791 A1 | 12/2005 | Nagasaka et al. |
| 2006/0231206 A1 | 10/2006 | Nagasaka et al. |
| 2007/0242249 A1 * | 10/2007 | Shibazaki et al. ............. 355/55 |
| 2007/0242255 A1 * | 10/2007 | Nagasaka ....................... 355/69 |
| 2007/0242363 A1 | 10/2007 | Noboru et al. |
| 2007/0279606 A1 * | 12/2007 | Nagasaka ....................... 355/40 |

FOREIGN PATENT DOCUMENTS

| | | |
|---|---|---|
| JP | A-6-120108 | 4/1994 |
| JP | A-10-163099 | 6/1998 |
| JP | A-10-214783 | 8/1998 |
| JP | A-11-135400 | 5/1999 |
| JP | A-2000-21748 | 1/2000 |
| JP | A-2000-505958 | 5/2000 |
| JP | A-2000-164504 | 6/2000 |
| JP | A-2004-289126 | 10/2004 |
| JP | A-2007-201457 | 8/2007 |
| JP | A-2007-287760 | 11/2007 |
| WO | WO 99/23692 A1 | 5/1999 |
| WO | WO 99/46835 A1 | 9/1999 |
| WO | WO 99/49504 | 9/1999 |
| WO | WO 02/069049 A2 | 9/2002 |
| WO | WO 2004/055803 A1 | 7/2004 |
| WO | WO 2004/057590 A1 | 7/2004 |
| WO | WO 2004/086468 A1 | 10/2004 |
| WO | WO 2005/029559 A1 | 3/2005 |

OTHER PUBLICATIONS

Written Opinion of the International Search Authority issued on Dec. 16, 2009 in International Patent Application No. PCT/JP2009/067200.

* cited by examiner

EXPOSURE APPARATUS, EXPOSURE METHOD, AND METHOD FOR PRODUCING DEVICE

CROSS-REFERENCES TO RELATED APPLICATIONS

This application claims the benefit of priority of U.S. Provisional Application No. 61/136,725 filed on Sep. 29, 2008, the entire disclosures of which are incorporated herein by reference.

BACKGROUND OF THE INVENTION

1. Field of the Invention

The present invention relates to a scanning type exposure apparatus which transfers a pattern of a mask to a photosensitive substrate, an exposure method, and a method for producing a device.

2. Description of the Related Art

In the photolithography step for producing, for example, a semiconductor device or element, an exposure apparatus is used, wherein a pattern of an image (pattern image) of a mask (or a reticle) is projected onto a photosensitive substrate (for example, a wafer coated with a photoresist) via a projection optical system to perform the exposure. In the ordinary exposure apparatus, one pattern is formed on one shot area on the photosensitive substrate. On the other hand, in order to improve the throughput, an exposure apparatus of the double exposure system has been suggested, wherein a same shot area on a photosensitive substrate is subjected to the scanning exposure with two patterns by using a so-called two-headed type projection optical system (see, for example, Japanese Patent Application Laid-open No. 2007-201457).

In recent years, it has been investigated to large-size the photosensitive substrate to be used for the photolithography step. However, in the conventional technique as described above, when the number of shot areas provided on the photosensitive substrate is increased as the photosensitive substrate is large-sized, the throughput of the photolithography step is lowered approximately in proportion to the ratio of the increase.

An object of aspects of the present invention is to provide an exposure apparatus, an exposure method, and a method for producing a device which make it possible to achieve the improvement in the throughput in relation to the scanning exposure.

SUMMARY OF THE INVENTION

According to a first aspect of the prevent invention, there is provided an exposure apparatus comprising: a mask-moving section which holds a mask formed with a pattern and which is movable in a first direction; an illumination system which irradiates an exposure light onto the mask held by the mask-moving section and which forms a first illumination area and a second illumination area separated from each other by a spacing distance in the first direction; a substrate-moving section which holds a photosensitive substrate and which is movable in a second direction corresponding to the first direction and in synchronization with the mask-moving section; a projection optical system which forms a first projected image of the pattern positioned in the first illumination area and a second projected image of the pattern positioned in the second illumination area, on the photosensitive substrate held by the substrate-moving section; and a restricting section which restricts the first projected image and the second projected image on the photosensitive substrate to be within a first projection area and a second projection area respectively; wherein an area-to-area spacing distance, in the first direction, between a first conjugate area optically conjugate with the first projection area via the projection optical system and a second conjugate area optically conjugate with the second projection area via the projection optical system is set to be such a spacing distance that scanning exposures with the pattern with respect to a first transfer area and a second transfer area provided adjacently in the second direction on the photosensitive substrate are successively performed correspondingly to synchronous movement of the mask-moving section and the substrate-moving section.

According to a second aspect of the present invention, there is provided an exposure apparatus which exposes a substrate with an image of a pattern formed on a mask, the exposure apparatus comprising: an illumination system which forms a first illumination area and a second illumination area, with a spacing distance, on a plane same as the mask; a mask-moving section which is movable continuously while holding the make to make the pattern pass successively through the first illumination area and the second illumination area; a projection system which projects a first image and a second image on the substrate, the first image and the second image being formed when the pattern passes through the first illumination area and the second illumination area, respectively; and a substrate-moving section which is movable continuously, while holding the substrate, in a direction corresponding to movement of the mask-moving section and in synchronization with the movement of the mask-moving section to successively form the first image and the second image in different areas, respectively, on the substrate.

According to a third aspect of the present invention, there is provided an exposure method comprising: irradiating an exposure light onto a mask formed with a pattern to form a first illumination area and a second illumination area which are separated from each other by a spacing distance in a first direction; forming, on a photosensitive substrate, a first projected image of the pattern positioned in the first illumination area and a second projected image of the pattern positioned in the second illumination area; and synchronously moving the mask and the photosensitive substrate in the first direction and a second direction corresponding to the first direction respectively to successively perform scanning exposure operations with the pattern with respect to a first transfer area and a second transfer area which are provided adjacently in the second direction on the photosensitive substrate.

According to a fourth aspect of the present invention, there is provided an exposure method for exposing a substrate with an image of a pattern formed on a mask, the exposure method comprising: forming a first illumination area and a second illumination area, with a spacing distance, on a plane same as the mask; moving the mask continuously relative to the first illumination area and the second illumination area to make the pattern pass successively through the first illumination area and the second illumination area; projecting a first image and a second image on the substrate, the first image and the second image being formed when the pattern passes through the first illumination area and the second illumination area, respectively; and moving the substrate continuously in a direction corresponding to movement of the mask and in synchronization with the movement of the mask to successively form the first image and the second image in different areas, respectively, on the substrate.

According to a fifth aspect of the present invention, there is provided a method for producing a device, comprising: using the exposure apparatus according to the first or second aspect of the present invention or the exposure method according to the third or fourth aspect of the present invention to transfer the pattern of the mask to the photosensitive substrate; and processing the photosensitive substrate, to which the pattern has been transferred, based on the pattern.

According to the aspects of the present invention, it is possible to achieve the improvement in the throughput in relation to the scanning exposure.

DESCRIPTION OF THE PREFERRED EMBODIMENT OF THE INVENTION

Figure 1:
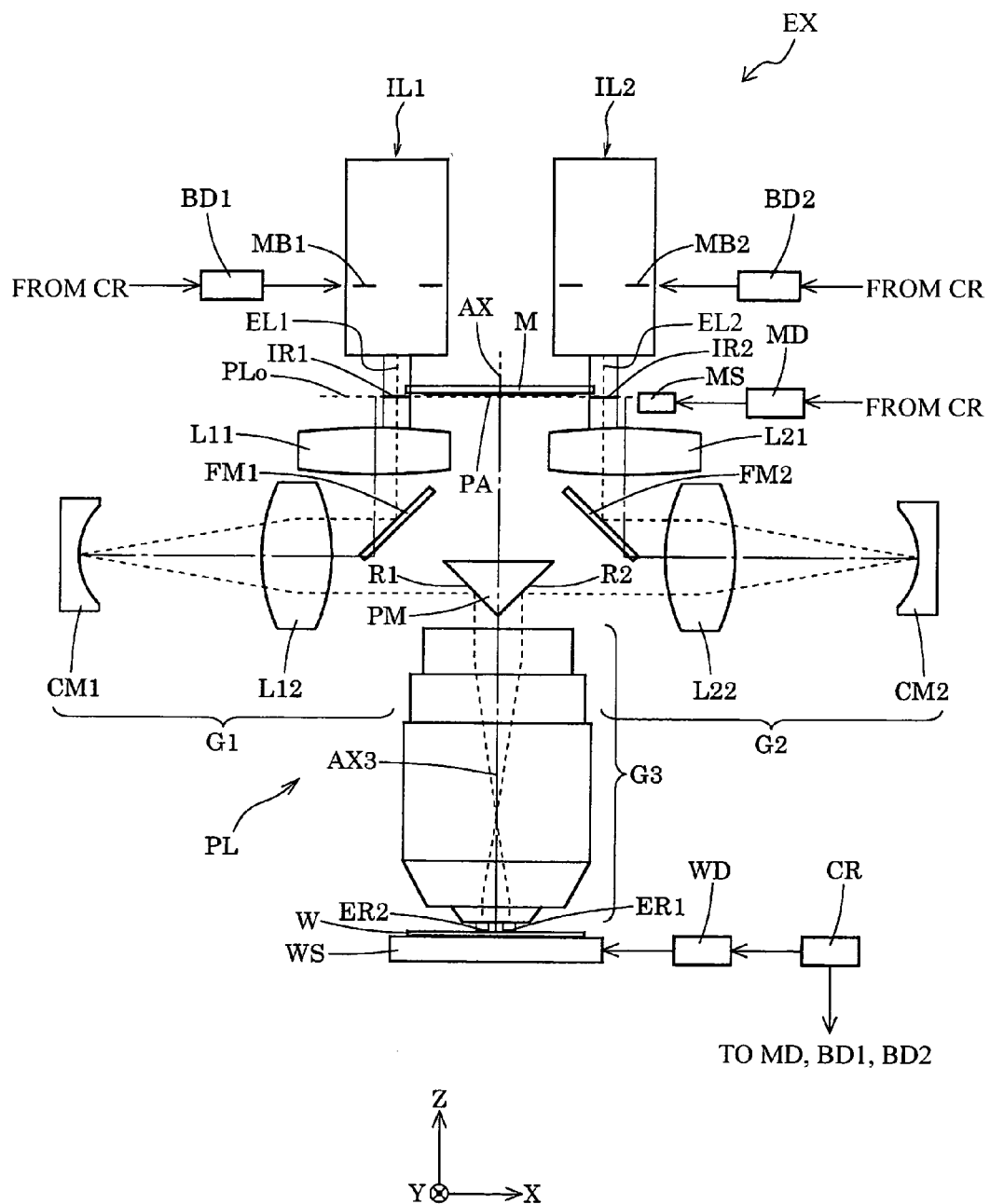
FIG. 1 shows a construction of an exposure apparatus according to a first embodiment of the present invention.

An embodiment of the present invention will be explained based on the attached drawings. FIG. 1 shows the construction of an exposure apparatus according to a first embodiment of the present invention. In FIG. 1, the Z axis is defined in a direction of a reference optical axis AX of a projection optical system PL, the X axis is defined in parallel to the sheet surface of FIG. 1 in a plane perpendicular to the optical axis AX, and the Y axis is defined perpendicularly to the sheet surface of FIG. 1 in the plane perpendicular to the optical axis AX.

The exposure apparatus EX of the first embodiment includes a pair of illumination systems IL1, IL2 which illuminate a mask M formed with a predetermined pattern with an exposure light (illumination light) radiated from a light source or light sources (not shown). The pair of illumination systems IL1, IL2 are mutually constructed in the same manner, and are provided symmetrically in relation to the YZ plane including the reference optical axis AX of the projection optical system PL. The second illumination system IL2 is arranged while being separated by a spacing distance on the side in the +X direction from the first illumination system IL1. Each of the illumination systems IL1, IL2 includes an individual light source or a common light source is provided for the illumination systems IL1, IL2; and each of the illumination systems IL1 and IL2 is constructed of an optical integrator, a field diaphragm, a condenser lens, etc. As the light source, it is possible to use, for example, the ArF excimer laser. Instead of the ArF excimer laser, it is also allowable to use another light source, for example, a high harmonic wave-generating device which includes, for example, a solid laser light source such as a DFB semiconductor laser or a fiber laser; a light-amplifying section having a fiber amplifier or the like; and a wavelength-converting section, and which outputs a pulse light beam having a wavelength of 193 nm as disclosed, for example, in International Publication No. 1999/46835 (corresponding to U.S. Pat. No. 7,023,610).

Figure 2:
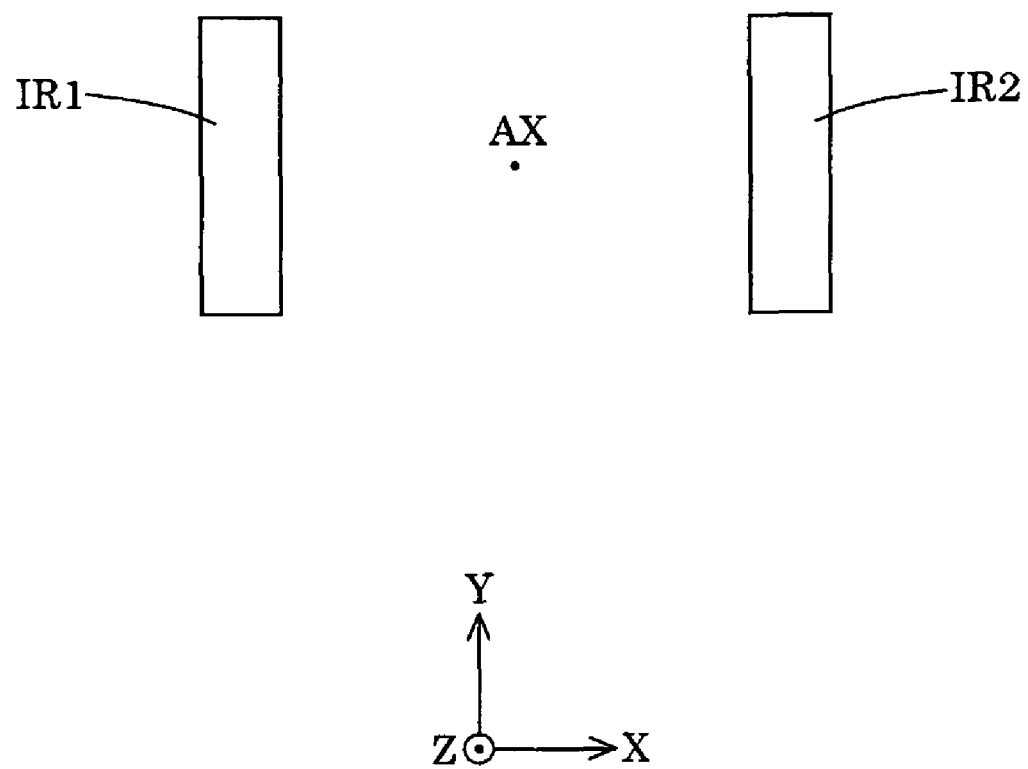
FIG. 2 shows a pair of illumination areas formed on an object plane of a projection optical system.

The illumination systems IL1, IL2 form illumination areas IR1, IR2, with exposure lights (illumination lights) EL1, EL2 irradiated from the illumination systems IL1, IL2 respectively, on an object plane PLo of the projection optical system PL (a surface of the mask or a plane same as the surface of the mask) respectively. In a reference state in relation to the scanning exposure, as shown in FIG. 2, each of the illumination areas IR1, IR2 has a rectangular outer shape which is long in the Y direction, and the illumination areas IR1, IR2 are formed symmetrically in relation to the YZ plane including the reference optical axis AX. The second illumination area IR2 is formed while being separated, by a spacing distance on the side in the +X direction, from the first illumination area IR1. However, the shapes and the sizes of the illumination areas IR1, IR2 during the scanning exposure are defined by mask blinds MB1, MB2 which serve as field diaphragms and are arranged in the illumination systems IL1, IL2 at positions substantially optically conjugate with the object plane PLo.

Each of the mask blinds MB1, MB2 is constructed by using a light-shielding member (movable blind) provided movably in a direction intersecting the optical path for the exposure light (for example, in a direction perpendicular to the optical path); and each of the mask blinds MB1, MB2 moves the light-shielding member to control the area of an opening (light-transmitting portion) defined by the light-shielding member. The operations of the mask blinds MB1, MB2 are controlled by blind-driving systems BD1, BD2 based on instruction from a controller CR. Reference may be made, for example, to Japanese Patent Application Laid-open No. 2007-287760 (corresponding to U.S. Patent Application Publication No. US 2007/0242363) in relation to specific constructions and operations of the mask blinds MB1, MB2. The contents of U.S. Patent Application Publication No. US 2007/0242363 are incorporated herein by reference within a range of permission of the domestic laws and ordinances.

The mask M is held in parallel to the XY plane on a mask stage MS. The mask M is positioned so that a pattern area PA of the mask M is substantially coincident with the object plane PLo of the projection optical system PL. FIG. 1 shows a state that the mask stage MS is separated from the mask M in order to clarify the drawing. The mask stage MS is two-dimensionally movable along the XY plane in accordance with the action of a mask-driving system MD, based on instruction from the controller CR. The position coordinate of the mask stage MS is measured by a mask interferometer (not shown), and the position of the mask stage MS is controlled by the mask interferometer.

The light EL1, which is transmitted through the first illumination area IR1 and the pattern area PA, passes through the so-called two-headed type projection optical system PL, and the light EL1 forms a projected image of the pattern in a first projection area ER1 on a wafer W as a photosensitive substrate (as well as on the image plane of the projection optical system PL). On the other hand, the light EL2, which is transmitted through the second illumination area IR2 and the pattern area PA, passes through the projection optical system PL, and the light EL2 forms a projected image of the pattern in a second projection area ER2 on the wafer W.

Figure 3:
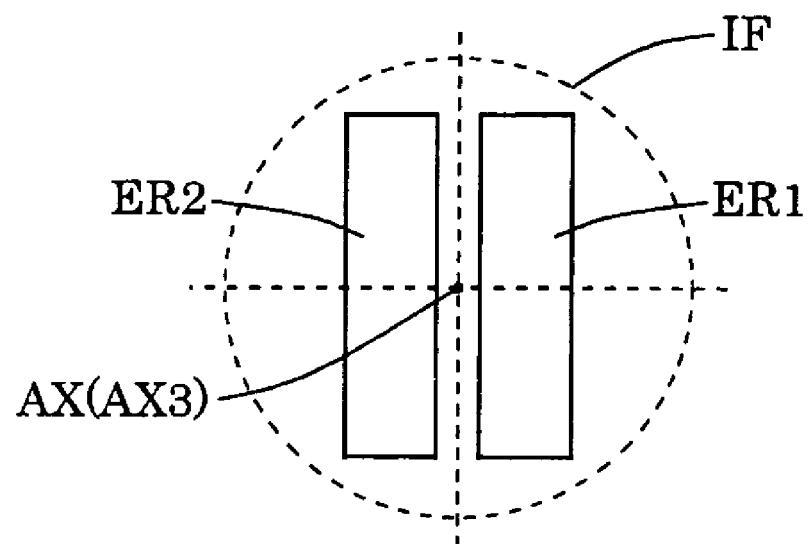
FIG. 3 shows a pair of projection areas formed on a wafer.
Figure 3:
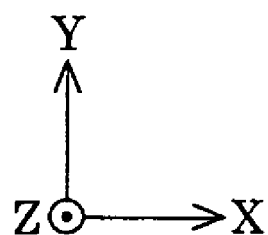

The projection areas ER1, ER2 are the areas which are optically conjugate with the illumination areas IR1, IR2. Therefore, as shown in FIG. 3, the projection areas ER1, ER2 have outer shapes which are long in the Y direction, and are formed symmetrically in relation to the YZ plane including the reference optical axis AX in an image field IF of the projection optical system PL. However, the second projection area ER2 is formed while being separated, by a spacing distance on the side in the −X direction, from the first projection area ER1. The specific construction and the action of the projection optical system PL will be described later on.

The wafer W is held in parallel to the XY plane on the wafer stage WS. The wafer W is positioned so that the surface of the wafer W (transfer surface; photosensitive surface) is substantially coincident with the image plane of the projection optical system PL. The wafer stage WS is two-dimensionally movable along the XY plane in accordance with the action of a wafer-driving system WD based on the instruction supplied from the controller CR. The position coordinate of the wafer stage WS is measured by a wafer interferometer (not shown), and the position of the wafer stage WS is controlled by the wafer interferometer.

The Exposure apparatus EX is provided with a wafer alignment system which detects an alignment mark formed on each shot areas on the wafer W, and a mask alignment system which detects an alignment mark formed on the mask M to thereby position the each shot area on the wafer W on the wafer stage WS and a pattern PA formed on the mask M. Examples of these alignment systems, it is allowable to use alignment systems as disclosed, for example, in Japanese Patent Application Laid-open No. 4-65603 (corresponding to U.S. Pat. No. 5,493,403), U.S. Pat. No. 5,646,413, etc. Here, any explanation on the specific constructions and operations of the alignment systems will be omitted.

In the first embodiment, the mask stage MS and the wafer stage WS are synchronously moved in the X direction at a velocity ratio corresponding to the magnitude (absolute value) β of the projection magnification of the projection optical system PL. Accordingly, the pattern (a first image formed by the pattern) in the pattern area PA, which is illuminated in the first illumination area IR1, is transferred to a first shot area (first transfer area) on the wafer W, and the pattern (a second image formed by the pattern) of the pattern area PA, which is illuminated in a second illumination area IR2, is transferred to a second shot area (second transfer area) disposed adjacently to the first shot area in the X direction. Details will be described later on about the exposure operation in which the scanning exposure is continuously performed for the two adjoining or adjacent shot areas.

With reference to FIG. 1 again, the projection optical system PL has a first imaging system G1 which forms a first intermediate image of the pattern illuminated in the first illumination area IR1, a second imaging system G2 which forms a second intermediate image of the pattern illuminated in the second illumination area IR2, and a third imaging system G3 which forms the projected image of the pattern in the first projection area ER1 based on the first intermediate image and which forms the projected image of the pattern in the second projection area ER2 based on the second intermediate image. The third imaging system G3 is a dioptric optical system, and an optical axis AX3 of the third imaging system G3 is coincident with the reference optical axis AX of the projection optical system PL.

The first imaging system G1 and the second imaging system G2 are mutually constructed in the same manner, and are catadioptric optical systems provided symmetrically in relation to the YZ plane including the optical axis AX3 of the third imaging system G3 (as well as the reference optical axis AX). Specifically, the first imaging system G1 (second imaging system G2) is provided with a field lens L11 (L21), a flat reflecting mirror FM1 (FM2), a positive lens group L12 (L22), and a concave reflecting mirror CM1 (CM2) as referred to in an order of the incidence of the light. A deflecting member PM, which has reflecting surfaces R1, R2, is arranged in the optical path between the first and second imaging systems G1, G2 and the third imaging system G3.

In the projection optical system PL, the light come from the pattern illuminated in the first illumination area IR1 passes along the field lens L11, the flat reflecting mirror FM1, and the positive lens group L12, and the light comes into the concave reflecting mirror CM1. The light reflected by the concave reflecting mirror CM1 forms the first intermediate image via the positive lens group L12. The first intermediate image is, for example, a substantially 1× magnification image of the mask pattern, and the image is erected in the X direction and inverted in the Y direction. The light from the first intermediate image is reflected by the reflecting surface R1 of the deflecting member PM, and the light forms a projected image (a first projected image) of the pattern in the first projection area ER1 on the wafer W via the third imaging system G3. The first projected image is, for example, a reduction image of about ¼ of the mask pattern, and the image is inverted in the X direction and erected in the Y direction.

Similarly, the light come from the pattern illuminated in the second illumination area IR2, passes along the field lens L21, the flat reflecting mirror FM2, and the positive lens group L22, and the light comes into the concave reflecting mirror CM2. The light reflected by the concave reflecting mirror CM2 forms the second intermediate image via the positive lens group L22. The second intermediate image is, for example, a substantially 1× magnification image of the mask pattern, and the image is erected in the X direction and inverted in the Y direction in the same manner as the first intermediate image. The light from the second intermediate image is reflected by the reflecting surface R2 of the deflecting member PM, and the light forms the projected image of the pattern in the second projection area ER2 on the wafer W via the third imaging system G3. The second projected image is, for example, a reduction image of about ¼ of the mask pattern, and the image is inverted in the X direction and erected in the Y direction in the same manner as the first projected image.

In this way, in the first embodiment, the +X direction (or the −X direction) in the mask stage MS and the −X direction (or the +X direction) in the wafer stage WS optically correspond to one another via the projection optical system PL. Therefore, when the scanning exposure is performed for each of the shot areas, the mask stage MS is moved in the +X direction (or in the −X direction) while holding the mask M formed with the pattern, and the wafer stage WS is moved, in synchronization with the mask stage MS, in the −X direction (or in the +X direction) (i.e., in the direction opposite to that of the mask stage MS) while holding the wafer W.

That is, in the first embodiment, the wafer stage WS is moved in the direction directed from the first projection area ER1 to the second projection area ER2 (in the direction of the −X direction) in the X direction in synchronization with the movement in which the mask stage MS is moved in the direction directed from the first illumination area (first conjugate area) IR1 to the second illumination area (second conjugate area) IR2 (in the direction of the +X direction) in the X direction. In another situation, the wafer stage WS is moved in the direction of the +X direction in synchronization with the movement in which the mask stage MS is moved in the direction of the −X direction. Note that, before performing the scanning exposure for each of the shot areas, the alignment mark formed in the mask M and the alignment mark formed in the wafer W are detected by the alignment systems to thereby control the position of the mask stage MS and the position the wafer stage WS and to position the pattern area PA of the mask M with respect to the each of the shot areas.

An explanation will be made below with reference to FIGS. 4 to 7 about the exposure operation in which the scanning exposure is continuously performed for two adjacent or adjoining shot areas in the first embodiment. FIGS. 4 to 7 are illustrative of an exemplary case of the scanning exposure in which the mask stage MS is moved in the +X direction and the wafer stage WS is moved in the −X direction by way of example. As depicted by solid lines in FIG. 4, the scanning exposure is started for a first shot area SR1 at the point in time at which an edge PAPX on the side in the +X direction of the pattern area PA of the mask M is coincident with an edge IR1MX on the side in the −X direction of the first illumination area IR1. At the time point of the start of the scanning exposure for the first shot area SR1, since the first shot area SR1 and the pattern PA have been already positioned with respect to each other via the alignment system before the start of the exposure, an edge SR1MX on the side in the −X direction of the first shot area SR1 is coincident with an edge ER1PX on the side in the +X direction of the first projection area ER1, as depicted by solid lines in FIG. 5.

Figure 4:
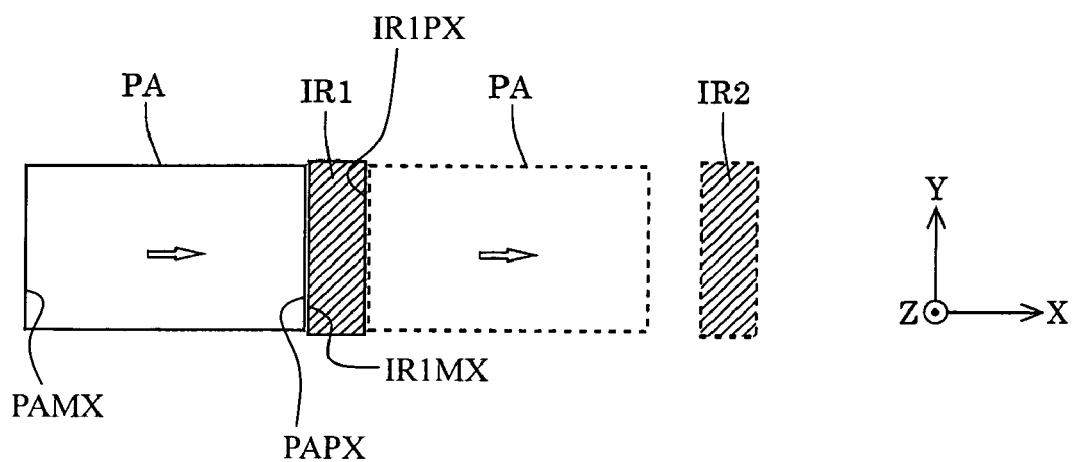
FIG. 4 shows positional relationships between the illumination areas and a pattern area at a start time point and an end time point of the scanning exposure for a first shot area in the first embodiment.
Figure 5:
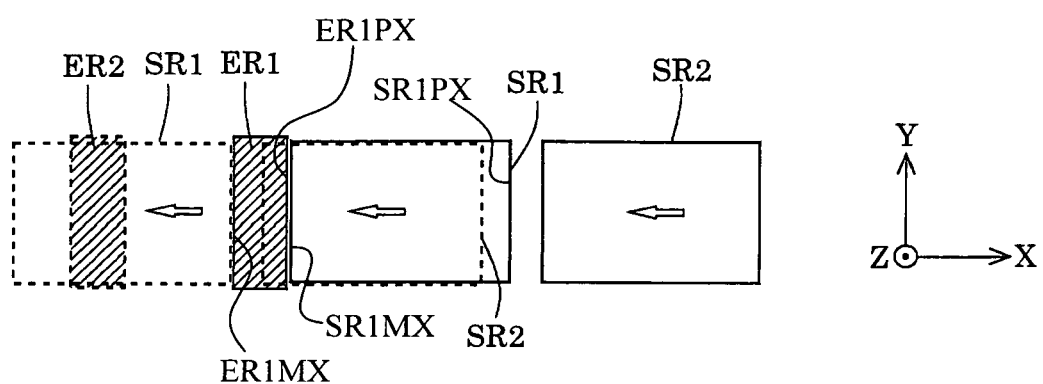
FIG. 5 shows positional relationships between the projection areas and shot areas at the start time point and the end time point of the scanning exposure for the first shot area in the first embodiment.

Subsequently, as shown by broken lines in FIG. 4, the scanning exposure for the first shot area SR1 is completed at the point in time at which an edge PAMX on the side in the −X direction of the pattern area PA is moved to an edge IR1PX on the side in the +X direction of the first illumination area IR1. At the time point at which the scanning exposure for the first shot area SR1 is completed, as shown by broken lines in FIG. 5, an edge SR1PX on the side in the +X direction of the first shot area SR1 is coincident with an edge ER1MX on the side in the −X direction of the first projection area ER1.

However, when the scanning exposure is performed for the first shot area SR1, the second illumination area IR2 (as well as the second projection area ER2) is not formed in accordance with the action of the mask blind MB2 included in the second illumination system IL2 (the blind is closed) so that the first shot area SR1 is not affected by the second projection area ER2. In other words, the illumination systems IL1, IL2 successively form the first illumination area IR1 (as well as the first projection area ER1) and the second illumination area IR2 (as well as the second projection area ER2). In this procedure, the mask blinds MB1, MB2 decrease the areas of the openings of the blinds by successively increasing the size in the X direction of the first projection area ER1 and the size in the X direction of the second projection area ER2 respectively.

Further, the size of the first illumination area IR1 in the X direction (as well as the first projection area ER1) is gradually decreased from a predetermined value in the reference state to zero (0) in accordance with the action of the mask blind MB1 included in the first illumination system IL1 so that the second shot area SR2 following the first shot area SR1 is not affected by the first projection area ER1 during the scanning exposure for the first shot area SR1. Specifically, the size in the X direction of the first illumination area IR1 (as well as the first projection area ER1) starts to be decreased at the point in time at which the edge SR1PX on the side in the +X direction of the first shot area SR1 goes past the edge ER1PX on the side in the +X direction of the first projection area ER1, and the size in the X direction of the first illumination area IR1 (as well as the first projection area ER1) is decreased to zero so that the second shot area SR2 is not affected by the first projection area ER1.

Figure 6:
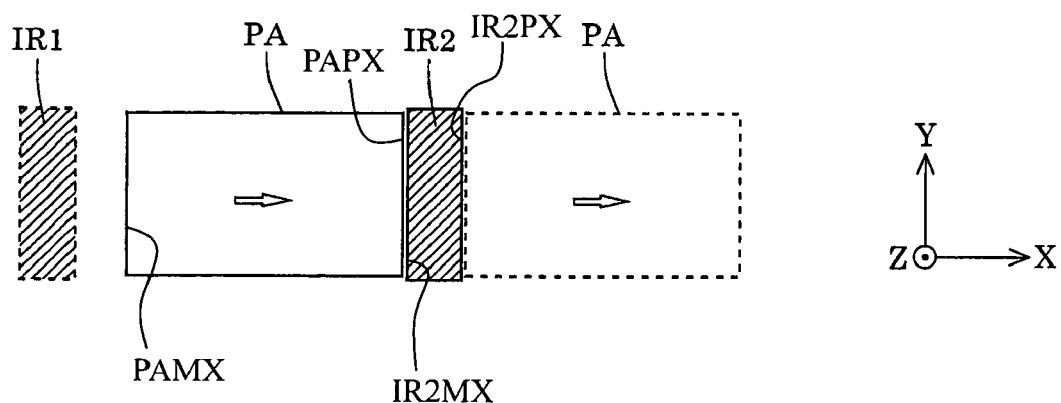
FIG. 6 shows positional relationships between the illumination areas and the pattern area at a start time point and an end time point of the scanning exposure for the second shot area in the first embodiment.
Figure 7:
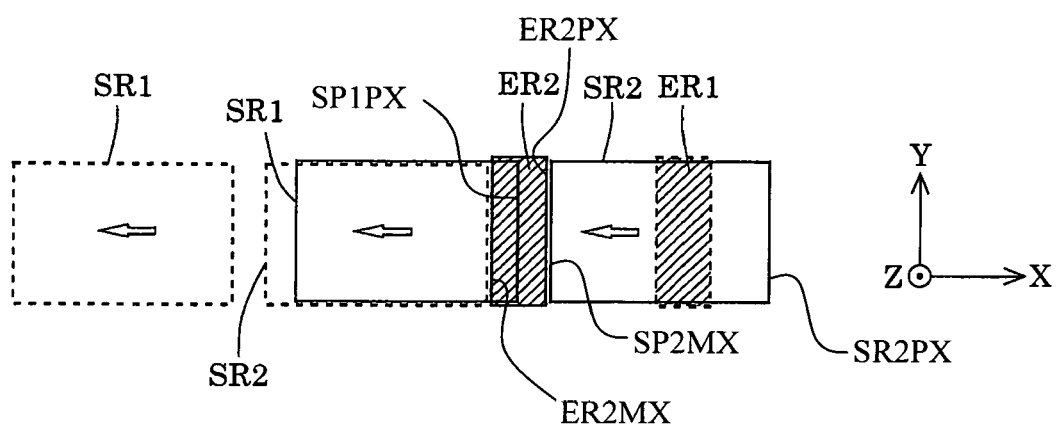
FIG. 7 shows positional relationships between the projection areas and the shot areas at the start time point and the end time point of the scanning exposure for the second shot area in the first embodiment.

The scanning exposure for the second shot area SR2 is started at the point in time at which the mask stage MS is further moved in the +X direction, and the edge PAPX on the side in the +X direction of the pattern area PA is coincident with an edge IR2MX on the side in the −X direction of the second illumination area IR2 as depicted by solid lines in FIG. 6. At the time point at which the scanning exposure is started for the second shot area SR2, an edge SR2MX on the side in the −X direction of the second shot area SR2 is coincident with an edge ER2PX on the side in the +X direction of the second projection area ER2, as depicted by solid lines in FIG. 7. However, prior to the start of the scanning exposure for the second shot area SR2, the size in the X direction of the second illumination area IR2 (as well as the second projection area ER2) is gradually increased from zero to the predetermined value in the reference state in accordance with the action of the mask blind MB2 while preventing the first shot area SR1 from being affected by the second projection area ER2.

Subsequently, the scanning exposure for the second shot area SR2 is completed at the point in time at which the edge PAMX on the side in the −X direction of the pattern area PA is moved to an edge IR2PX on the side in the +X direction of the second illumination area IR2, as depicted by broken lines in FIG. 6. At the time point at which the scanning exposure is completed for the second shot area SR2, an edge SR2PX on the side in the +X direction of the second shot area SR2 is coincident with an edge ER2MX on the side in the −X direction of the second projection area ER2, as depicted by broken lines in FIG. 7.

The size in the X direction of the second illumination area IR2 (as well as the second projection area ER2) is gradually decreased from the predetermined value in the reference state to zero in accordance with the action of the mask blind MB2 included in the second illumination system IL2 so that a third shot area (not shown) following the second shot area SR2 is not affected by the second projection area ER2 during or after the completion of the scanning exposure for the second shot area SR2. Specifically, the size in the X direction of the second illumination area IR2 (as well as the second projection area ER2) starts to be decreased at the point in time at which the edge SR2PX on the side in the +X direction of the second shot area SR2 goes past the edge ER2PX on the side in the +X direction of the second projection area ER2, and the size in the X direction of the second illumination area IR2 (as well as the second projection area ER2) is decreased to zero so that the third shot area is not affected by the second projection area ER2.

In this procedure, the size in the X direction of the first illumination area IR1 (as well as the first projection area ER1) is gradually decreased from the predetermined value in the reference state to zero by the mask blind MB1 so that the following second shot area SR2 is not affected by the first projection area ER1 during the scanning exposure for the first shot area SR1; and further, the size in the X direction of the second illumination area IR2 (as well as the second projection area ER2) is gradually increased from zero to the predetermined value in the reference state by the mask blind MB2 so that the first shot area SR1 is not affected by the second projection area ER2 prior to the start of the scanning exposure for the second shot area SR2. However, when the spacing distance between the first shot area SR1 and the second shot area SR2 is sufficiently wide, it is also allowable that the mask blinds MB1, MB2 remain open respectively.

Figure 8:
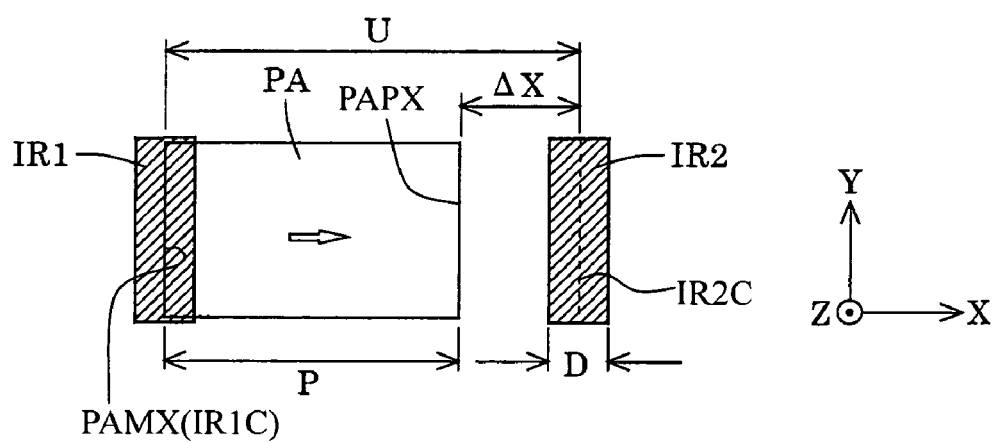
FIG. 8 is a first drawing illustrating a condition required to continuously perform the scanning exposure for two adjacent shot areas in the first embodiment.
Figure 9:
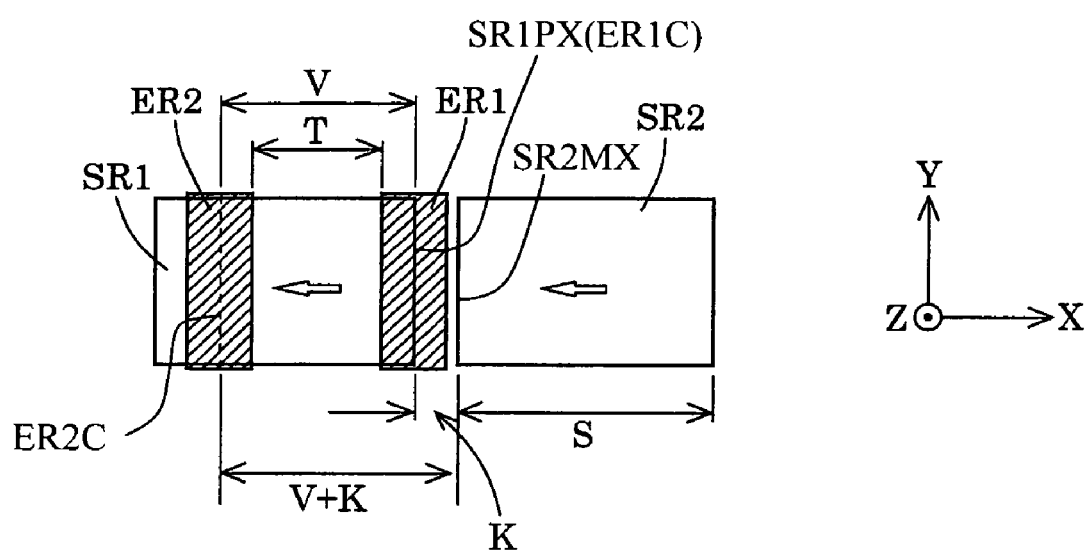
FIG. 9 is a second drawing illustrating the condition required to continuously perform the scanning exposure for the two adjacent shot areas in the first embodiment.

Next, an explanation will be made with reference to FIGS. 8 and 9 about the condition required to perform the scanning exposure continuously for the two adjacent shot areas SR1, SR2 in the first embodiment. In order to simplify the explanation, FIG. 8 shows a state that the edge PAMX on the side in the −X direction of the pattern area PA arrives at a center IR1C of the first illumination area IR1. FIG. 9 shows a state that the edge SR1PX on the side in the +X direction of the first shot area SR1 arrives at a center ER1C of the first projection area ER1 corresponding to the positional relationship between the pattern PA and the first illumination area IR1 shown in FIG. 8.

With reference to FIG. 8, reference symbol "U" indicates the center-to-center spacing distance in the X direction between the center IR1C of the first illumination area IR1 and a center IR2C of the second illumination area IR2. Reference symbol "P" indicates the size in the X direction of the pattern area PA, and reference symbol "D" indicates the size in the X direction of each of the first illumination area IR1 and the second illumination area IR2. Reference symbol "ΔX" indicates the distance in the X direction between the edge PAPX on the side in the +X direction of the pattern area PA and the center IR2C of the second illumination area IR2 in the state shown in FIG. 8.

With reference to FIG. 9, reference symbol "S" indicates the size in the X direction of each of the first shot area SR1 and the second shot area SR2, and reference symbol "K" indicates the spacing distance in the X direction between the first shot area SR1 and the second shot area SR2. Reference symbol "V" indicates the center-to-center spacing distance in the X direction between the center ER1C of the first projection area ER1 and a center ER2C of the second projection area ER2, and reference symbol "T" indicates the spacing distance in the X direction between the first projection area ER1 and the second projection area ER2.

In this case, the relationships hold as shown by the following expressions (1) to (4).

$$U = P + \Delta X \quad (1)$$

$$P = S/\beta \quad (2)$$

$$\Delta X = (V+K)/\beta \quad (3)$$

$$V = \beta \times D + T \quad (4)$$

Here, the expressions (1), (2) and (4) define the relationship derived from the distance in the X direction between the first illumination area IR1 and the second illumination area IR2, the length (width) in the X direction of each of the first illumination area IR1 and the second illumination area IR2, the length in the X direction of the pattern area PA, the distance in the X direction between the first projection area ER1 and the second projection area ER2 and the length (width) in the X direction of each of the first projection area ER1 and the second projection area ER2. The expression (3) shows the relationship among the length in the X direction of each of the first shot area SR1 and the second shot area SR2, the length in the X direction of the pattern area PA and the spacing distance in the X direction between the first shot area SR1 and the second shot area SR2 with respect to the projection magnification β, etc, and the expression (3) defines the following condition. That is, a situation is assumed in which the pattern PA is further moved, from the position of the pattern PA with respect to the second illumination area IR2 shown in FIG. 8, in the scanning direction (+X direction) by the distance ΔX and the edge PAPX on the side in the +X direction of the pattern area PA arrives at the center IR2C of the second illumination area IR2. In this situation, it is necessary that the transfer of the pattern PA onto the second shot area SR2 is started. Namely, the edge SR2MX on the side in the −X direction of the second shot area SR2 needs to arrive at the center ER2C of the second projection area ER2. If not so, the image of the pattern PA is not correctly transferred onto the second shot area SR2. Therefore, the second shot area SR2 needs to be moved by V+K while the pattern PA of the mask is moved by ΔX, and considering the projection magnification β, it is necessary that the relationship of ΔX=(V+K)/β holds. Note that the first shot area SR1 is positioned with respect to the pattern PA of the mask M by the alignment operation; and with respect to this, it is allowable that the second shot area SR2 is considered to be aligned, in relation to the first shot area SR1, via the relationship of the expression (3).

The following conditional expressions (A), (B), (C) are obtained from the relationships expressed in the expressions (1) to (4). The conditional expressions (A), (B), (C) differ only in the expression forms; and when one conditional expression of the conditional expressions is satisfied, the other two conditional expressions are also satisfied.

$$U=(S+K+V)/\beta \quad (A)$$

$$U=P+(K+V)/\beta \quad (B)$$

$$U=P+D+(T+K)/\beta \quad (C)$$

As described above, the first embodiment is constructed so that the center-to-center spacing distance U in the X direction, which is between the center IR1C of the first illumination area IR1 as the first conjugate area optically conjugate with the first projection area ER1 via the projection optical system PL and the center IR2C of the second illumination area IR2 as the second conjugate area optically conjugate with the second projection area ER2 via the projection optical system PL, satisfies the conditional expression (A) as well as the conditional expressions (B), (C). With this, the scanning exposure can be performed continuously for the two shot areas SR1, SR2 which are adjacent to one another in the X direction, by performing the synchronous movement in the X direction of the mask stage MS and the wafer stage WS once (synchronous movement including no step movement in the Y direction).

Figure 10:
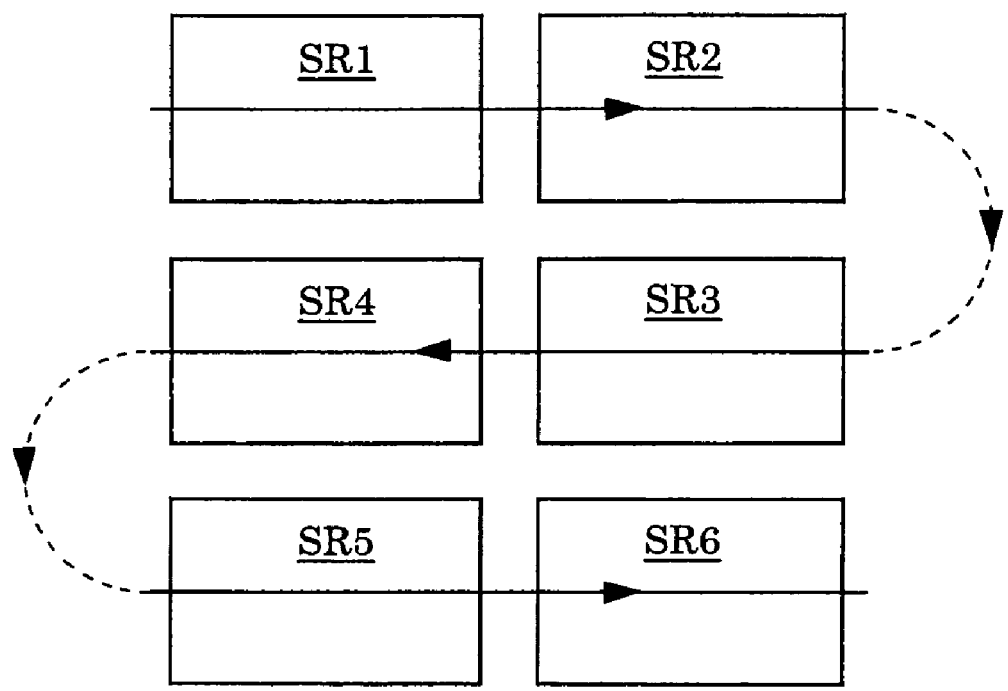
FIG. 10 illustrates a scanning procedure in the first embodiment.
Figure 10:
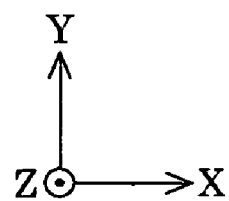

In the exposure apparatus of the first embodiment, the scanning exposure can be continuously performed for the two adjacent shot areas. Therefore, it is possible to achieve the improvement in the throughput in relation to the scanning exposure, for example, based on the simple scanning procedure as shown in FIG. 10. FIG. 10 schematically shows the locus of the reference optical axis AX of the projection optical system PL with respect to six shot areas SR1 to SR6 by way of example. In FIG. 10, the solid lines indicate the locus of the reference optical axis AX as brought about in accordance with the synchronous movement of the mask stage MS and the wafer stage WS during the scanning exposure for pairs of the shot areas, and the broken lines indicate the locus of the reference optical axis AX as brought about in accordance with the step movement of the wafer stage WS between the scanning exposure for a pair of the shot areas and the scanning exposure for the next pair of the shot areas. These loci indicate the relative loci of the reference optical axis AX relative to the respective shot areas.

Specifically, in the scanning procedure of the first embodiment shown in FIG. 10, the scanning exposure is performed for the first pair of the shot areas SR1, SR2 by moving the mask stage MS in the +X direction and moving the wafer stage WS in the −X direction. After that, the movement of the mask stage MS and the wafer stage WS is decelerated in relation to the X direction, and the movement direction is returned to accelerate the movement again, during which the wafer stage WS is step-moved in the +Y direction in order to perform the scanning exposure for the next pair of the shot areas SR3, SR4. Subsequently, the mask stage MS is moved in the −X direction, and the wafer stage WS is moved in the +X direction to perform the scanning exposure for the second pair of the shot areas SR3, SR4.

Further, the wafer stage WS is step-moved in the +Y direction in order to perform the scanning exposure for the next pair of the shot areas SR5, SR6. After that, the mask stage MS is moved in the +X direction, and the wafer stage WS is moved in the −X direction to perform the scanning exposure for the third pair of the shot areas SR5, SR6. In this way, in the exposure apparatus of the first embodiment, the operation of the scanning exposure for a pair of shot areas and the operation of the step movement to perform the scanning exposure for the next pair of shot areas are alternately repeated. In the exposure apparatus of the present invention, attention should be directed to the point that two shot areas are simultaneously (continuously) exposed by one time of scanning or by one-way scanning (one-scan two-shots exposure). Further, it is enough that the positioning (alignment) of the pattern PA with respect to the two shot areas is performed only for the shot area, among the two shot areas, which is to be exposed first.

Figure 11:
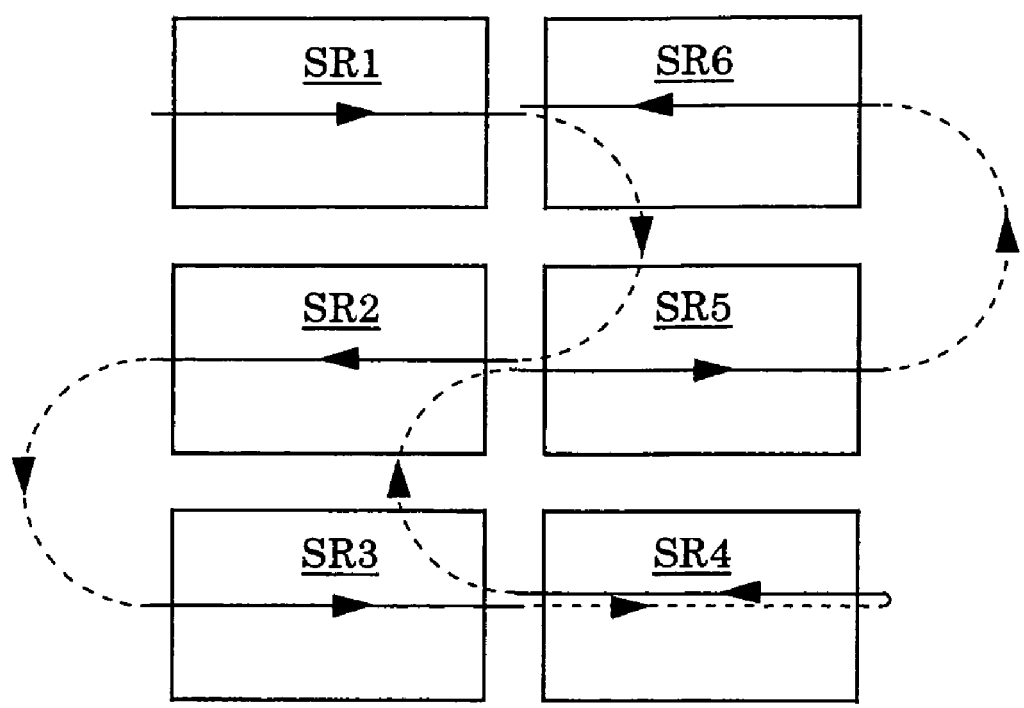
FIG. 11 illustrates a scanning procedure in a conventional technique.
Figure 11:
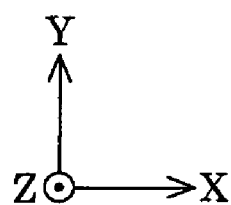

On the contrary, as described above, in the case of the conventional scanning exposure technique, only one shot area is exposure by one time of scanning. Therefore, basically, the step-movement is required every time the scanning is performed. Namely, the operation of the scanning exposure for one shot area and the operation of the step movement to perform the scanning exposure for the next shot area are alternately repeated. Therefore, as shown in FIG. 11, for example, the conventional scanning exposure technique requires a large number of the operations of the step movement; and the scanning procedure is relatively complex, and it is difficult to achieve the high throughput. Further, it is necessary that the positioning (alignment) of the pattern PA with respect to the shot area is performed for each of the shot areas. Also in FIG. 11, the solid lines indicate the locus of the reference optical axis of the projection optical system brought about during the scanning exposure for the respective shot areas, and the broken lines indicate the locus of the reference optical axis brought about in accordance with the step movement from one shot area to the next shot area in the same manner as in the procedure shown in FIG. 10.

Specifically, in the case of the scanning procedure of the conventional scanning exposure technique shown in FIG. 11, the scanning exposure for the shot area SR1, the step movement to perform the scanning exposure for the shot area SR2, the scanning exposure for the shot area SR2, the step movement to perform the scanning exposure for the shot area SR3, and the scanning exposure for the shot area SR3 are successively performed. Subsequently, after the linear step movement to perform the scanning exposure for the shot area SR4, the followings are successively performed: the scanning exposure for the shot area SR4; then the step movement to perform the scanning exposure for the shot area SR5, and then the scanning exposure for the shot area SR5; and then the step movement to perform the scanning exposure for the shot area SR6, and then the scanning exposure for the shot area SR6.

Figure 23:
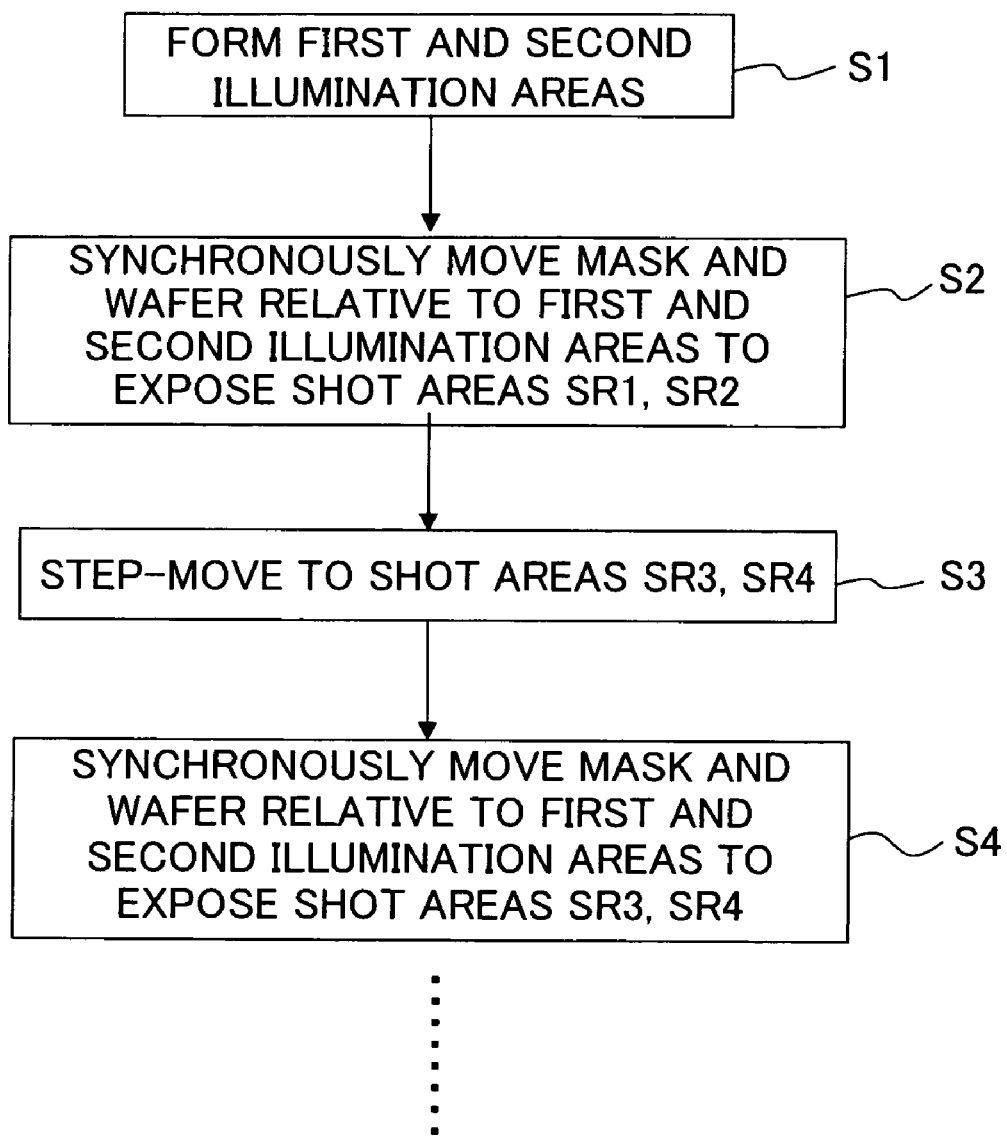
FIG. 23 is a flow chart illustrating the outline of an exposure method of the present invention.

As appreciated from the loci of the reference optical axis AX brought about the step-movements as shown in FIGS. 10 and 11, the scanning exposure method of the present invention has a route, for scanning the shot areas on the substrate (wafer) with the exposure light, which is simpler than that in the conventional scanning exposure method and in which the number of times for performing the step-movement (consequently, the number of times for decelerating and accelerating the wafer stage WS) is smaller than in the conventional scanning exposure method. Therefore, it is possible to improve the throughput. FIG. 23 shows a flow chart illustrating the outline of an exposure method of the present invention. The first illumination area IR1 and the second illumination area IR2 are formed on the mask M, in which the pattern PA is formed, by irradiating the exposure lights ER1, ER2 from the illumination systems IL1, IL2 onto the mask M at a spacing distance in the X direction (S).

Then, the pattern PA on the mask M and the shot area SR1 (SR2) on the wafer W are positioned with respect to each other via the alignment operation so as to position the pattern PA and the shot area SR1 with respect to each other before the exposure is started. Subsequently, the mask stage MS is moved in the +X direction (or the −X direction) relative to the first illumination area IR1 and the second illumination area IR2 and the wafer stage WS is moved, in synchronization with the movement of the mask stage MS, in the −X direction (or the +X direction) relative to the first illumination area IR1 and the second illumination area IR2 (S2). By the synchronized movement of the stages, the pattern PA on the mask M and the shot areas SR1, SR2 on the wafer W are also moved relative to the first illumination area IR1 and the second illumination area IR2. In this movement process, when the pattern PA passes through the first illumination area IR1, the image of the pattern PA is projected onto the shot area SR1 via the projection optical system PL (or the image of the pattern PA by the projection optical system) is projected onto the shot area SR1, and when the pattern PA passes through the second illumination area IR2, the image of the pattern PA is projected onto the shot area SR2 via the projection optical system PL.

Next, the wafer stage WS is step-moved in the Y direction such that the next shot areas SR3 and SR4 on the wafer W are irradiated with the exposure light EL1, EL2 from the illumination systems IL1, IL2, respectively (S3). Further, in the shot areas SR3 and SR4, the mask stage MS and the wafer stage W are synchronously moved with respect to the first illumination area IR2 and the second illumination area IR2 area, in a same manner as the operation performed for the shot areas SR1 and SR2 (but in the opposite direction as that regarding the shot areas SR1 and SR2) (S4). In such a manner, the shot areas on the wafer W are successively exposed by repeating the synchronous movement and the stepping movement.

In the first embodiment, the mask stage MS constructs the mask-moving section which is movable in the X direction while holding the mask M, and the wafer stage WS constructs the substrate-moving section which is movable in the X direction in synchronization with the mask stage MS while holding the wafer (photosensitive substrate) W. The pair of mask blinds MB1, MB2, the blind-driving systems BD1, BD2, and the controller CR construct the restricting section which restricts the first projected image and the second projected image of the pattern of the mask M projected onto the wafer W to be within the first projection area ER1 and the second projection area ER2 respectively.

In the first embodiment, the restricting section (MB1, MB2, BD1, BD2, CR) sets or defines the sizes (sizes in the X direction) of the first projection area ER1 and the second projection area ER2 based on the movement information corresponding to the movement position of the mask stage MS in the X direction (in the scanning direction) and the movement position of the wafer stage WS in the X direction (in general, in the direction corresponding to the scanning direction of the mask stage MS). The restricting section (MB1, MB2, BD1, BD2, CR) includes the mask blinds MB1, MB2 as the light-shielding members provided movably in the direction intersecting the optical paths for the exposure lights, the blind-driving systems BD1, BD2 and the controller CR as the shielding controllers to set or define the positions of the light-shielding members with respect to the optical paths for the exposure lights based on the movement information.

In the first embodiment, the projection optical system PL forms the first illumination area (first conjugate area) IR1 optically conjugate with the first projection area ER1 and the second illumination area (second conjugate area) IR2 optically conjugate with the second projection area ER2, with the spacing distance in the X direction based on the size S in the X direction of the first shot area SR1 (or the second shot area SR2), the spacing distance T in the X direction between the first projection area ER1 and the second projection area ER2, the spacing distance K in the X direction between the first shot area SR1 and the second shot area SR2, and the magnitude β of the projection magnification of the projection optical system PL. The illumination systems IL1, IL2 irradiate the exposure lights EL1 and EL2 onto the wafer W via the first illumination area IR1 and the second illumination area IR2, respectively.

Figure 12:
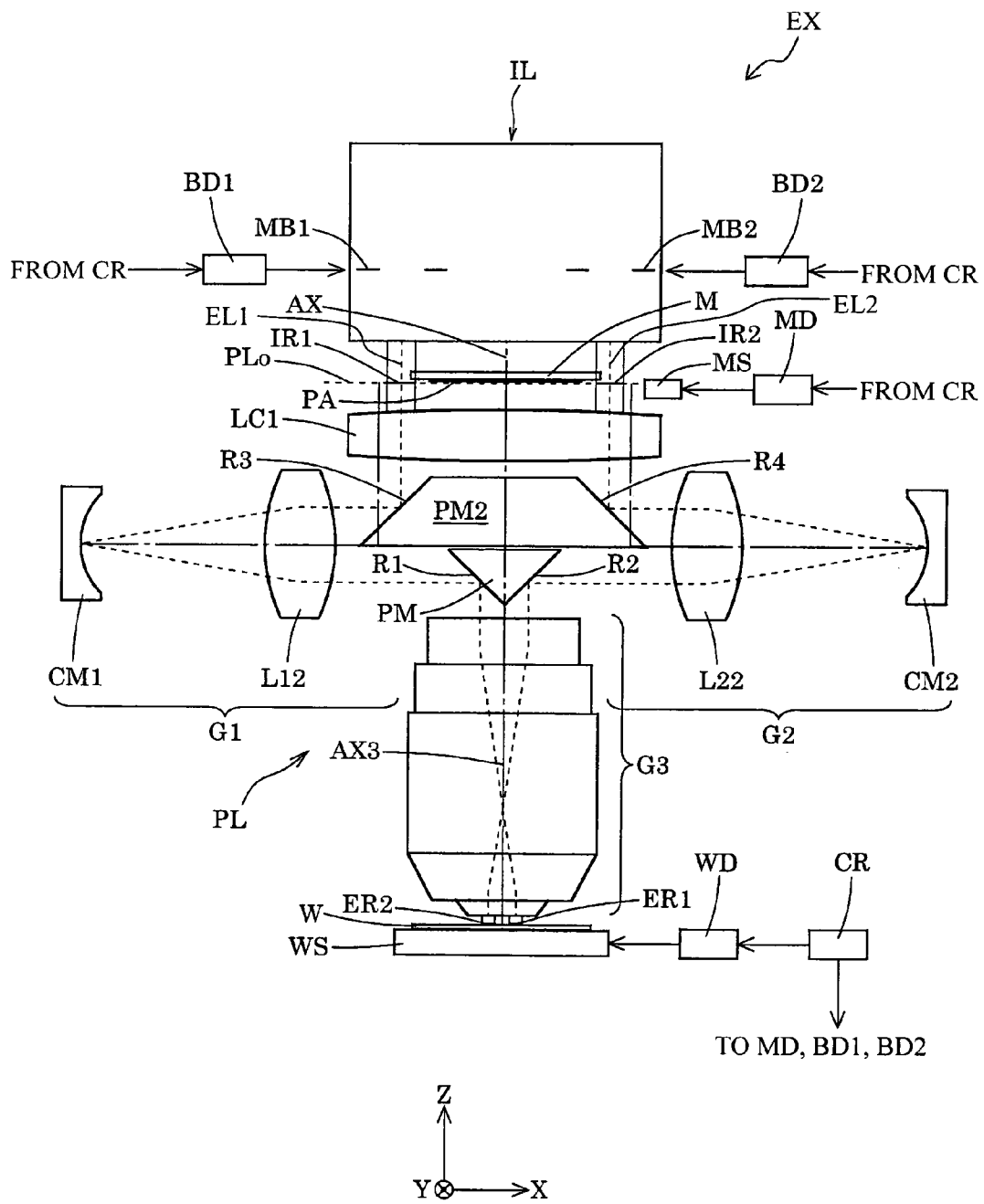
FIG. 12 shows a construction of an exposure apparatus according to a modification of the first embodiment.

FIG. 12 shows the construction of an exposure apparatus according to a modification of the first embodiment. In the modification shown in FIG. 12, the pair of illumination systems IL1, IL2 provided in the first embodiment are integrated into an illumination system IL which is common to the first illumination area IR1 and the second illumination area IR2. Further, the field lenses L11, L21 provided in the first embodiment are integrated into a field lens LC1 which is common to the first imaging system G1 and the second imaging system G2. Further, the flat reflecting mirrors FM1, FM2 provided in the first embodiment are integrated into one deflecting member PM2 which has a reflecting surface R3 for the first imaging system G1 and a reflecting surface R4 for the second imaging system G2.

Figure 13:
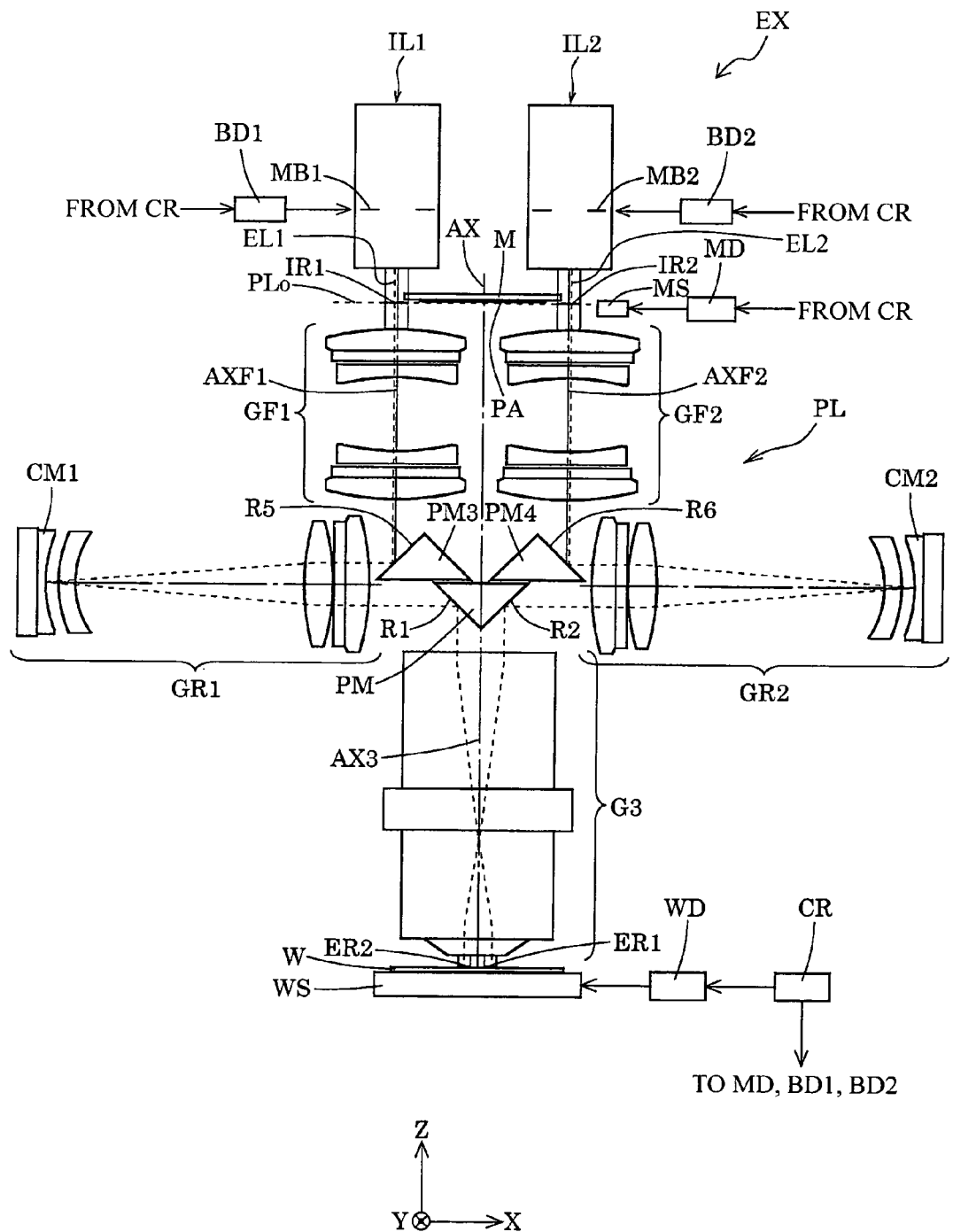
FIG. 13 shows a construction of an exposure apparatus according to a second embodiment of the present invention.

FIG. 13 shows the construction of an exposure apparatus according to a second embodiment of the present invention. The second embodiment is constructed similarly to the first embodiment. However, in the second embodiment, the construction of the projection optical system PL is different from that of the first embodiment, and the operation of the scanning exposure is consequently different from that of the first embodiment as well. In FIG. 13, the constitutive parts or components, which have the same or equivalent functions as those of the first embodiment shown in FIG. 1, are designated by the same reference numerals as those used in FIG. 1. The construction and the function of the second embodiment will be explained below while taking notice of the feature different from that of the first embodiment.

The projection optical system PL of the second embodiment includes a first front side imaging system GF1 which forms a first front side intermediate image of the pattern illuminated with an exposure light EL1 in a first illumination area IR1, a second front side imaging system GF2 which forms a second front side intermediate image of the pattern illuminated with an exposure light EL2 in a second illumination area IR2, a first rear side imaging system GR1 which forms a first rear side intermediate image based on the first front side intermediate image, a second rear side imaging system GR2 which forms a second rear side intermediate image based on the second front side intermediate image, and a third imaging system G3 which forms a projected image of the pattern in a first projection area ER1 based on the first rear side intermediate image and which forms a projected image of the pattern in a second projection area ER2 based on the second rear side intermediate image. The third imaging system G3 is a dioptric optical system, and the optical axis AX3 thereof is coincident with the reference optical axis AX of the projection optical system PL.

The first front side imaging system GF1 and the second front side imaging system GF2 are mutually constructed in the same manner, and are dioptric optical systems which are provided symmetrically in relation to the YZ plane including the optical axis AX3 of the third imaging system G3 (as well as the reference optical axis AX). The first rear side imaging system GR1 and the second rear side imaging system GR2 are mutually constructed in the same manner, and are catadioptric optical systems which are provided symmetrically in relation to the YZ plane including the optical axis AX3 of the third imaging system G3. Specifically, the first rear side imaging system GR1 (second rear side imaging system GR2) is provided with a lens group and a concave reflecting mirror CM1 (CM2) as referred to in an order of the incidence of the light.

A deflecting member PM3, which has a reflecting surface R5, is arranged in the optical path between the first front side imaging system GF1 and the first rear side imaging system GR1. A deflecting member PM4, which has a reflecting surface R6, is arranged in the optical path between the second front side imaging system GF2 and the second rear side imaging system GR2. A deflecting member PM, which has reflecting surfaces R1, R2, is arranged in the optical paths between the first and second rear side imaging systems GR1, GR2 and the third imaging system G3.

In the projection optical system PL of the second embodiment, the light, which comes from the pattern illuminated with the exposure light EL1 in the first illumination area IR1, forms the first front side intermediate image via the first front side imaging system GF1. The first front side intermediate image is, for example, a reduction image of the mask pattern, and the image is inverted in the X direction and the Y direction. The light, which comes from the first front side intermediate image, is reflected by the reflecting surface R5 of the deflecting member PM3 to form the first rear side intermediate image via the first rear side imaging system GR1. The first rear side intermediate image is, for example, a substantially 1× magnification image of the first front side intermediate image. The light, which comes from the first rear side intermediate image, is reflected by the reflecting surface R1 of the deflecting member PM to form the projected image of the pattern in the first projection area ER1 on the wafer W via the third imaging system G3. The first projected image is, for example, a reduction image of about ¼ of the mask pattern, and the image is erected in the X direction and inverted in the Y direction.

Similarly, the light, which comes from the pattern illuminated with the exposure light EL2 in the second illumination area IR2, forms the second front side intermediate image via the second front side imaging system GF2. The second front side intermediate image is, for example, a reduction image of the mask pattern, and the image is inverted in the X direction and the Y direction in the same manner as the first front side intermediate image described above. The light, which comes from the second front side intermediate image, is reflected by the reflecting surface R6 of the deflecting member PM4 to form the second rear side intermediate image via the second rear side imaging system GR2. The second rear side intermediate image is, for example, a substantially 1× magnification image of the second front side intermediate image in the same manner as the first rear side intermediate image. The light, which comes from the second rear side intermediate image, is reflected by the reflecting surface R2 of the deflecting member PM to form the projected image of the pattern in the second projection area ER2 on the wafer W via the third imaging system G3. The second projected image is, for example, a reduction image of about ¼ of the mask pattern, and the image is erected in the X direction and inverted in the Y direction in the same manner as the first projected image.

As described above, in the second embodiment, unlike the first embodiment, the +X direction (or the −X direction) in relation to the mask stage MS and the +X direction (or the −X direction) in relation to the wafer stage WS optically correspond to one another via the projection optical system PL. Therefore, in the second embodiment, when the scanning exposure is performed for each of the shot areas, then the mask stage MS is moved in the +X direction (or in the −X direction) while holding the mask M formed with the pattern, and the wafer stage WS is also moved in synchronization with the mask stage MS in the +X direction (or in the −X direction) (i.e., in the same direction as that of the mask stage MS) while holding the wafer W.

That is, in the second embodiment, inversely to the case of the first embodiment, the wafer stage WS is moved in a direction directed from the second projection area ER2 to the first projection area ER1 in the X direction (in the direction of the +X direction) in synchronization with the movement in which the mask stage MS is moved in a direction directed from the first illumination area (first conjugate area) IR1 to the second illumination area (second conjugate area) IR2 in the X direction (in the direction of the +X direction). In another situation, the wafer stage WS is moved in the direction of the −X direction in synchronization with the movement in which the mask stage MS is moved in the direction of the −X direction.

An explanation will be made below with reference to FIGS. 14 to 17 about the exposure operation in which the scanning exposure is continuously performed for the two adjacent shot areas in the second embodiment. FIGS. 14 to 17 are illustrative of an exemplary case of the scanning exposure in which the mask stage MS is moved in the +X direction and the wafer stage WS is moved in the +X direction by way of example. As depicted by solid lines in FIG. 14, the scanning exposure is started for the first shot area SR1 at the point in time at which the edge PAPX on the side in the +X direction of the pattern area PA of the mask M is coincident with the edge IR1MX on the side in the −X direction of the first illumination area IR1. At the time point of the start of the scanning exposure for the first shot area SR1, as depicted by solid lines in FIG. 15, the edge SR1PX on the side in the +X direction of the first shot area SR1 is coincident with the edge ER1MX on the side in the −X direction of the first projection area ER1.

Figure 14:
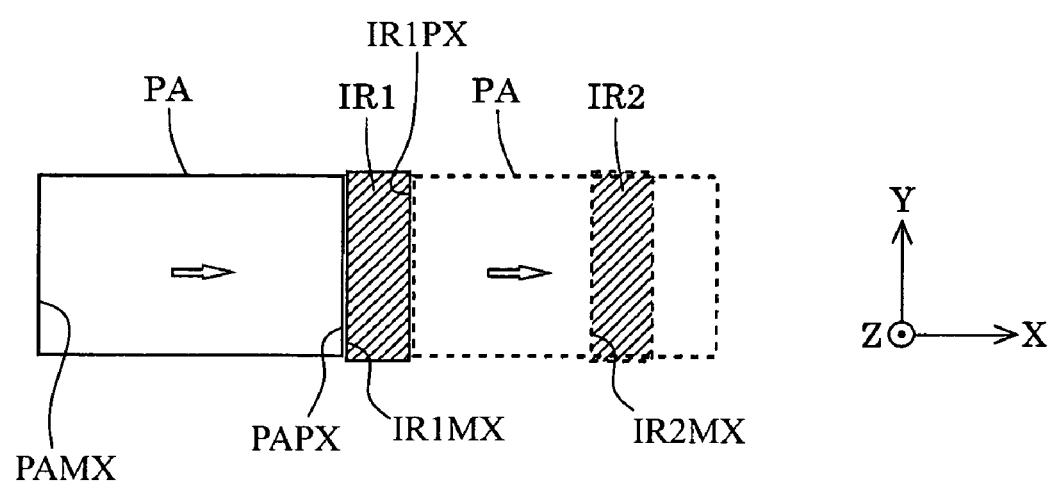
FIG. 14 shows positional relationships between illumination areas and a pattern area at a start time point and an end time point of the scanning exposure for a first shot area in the second embodiment.
Figure 15:
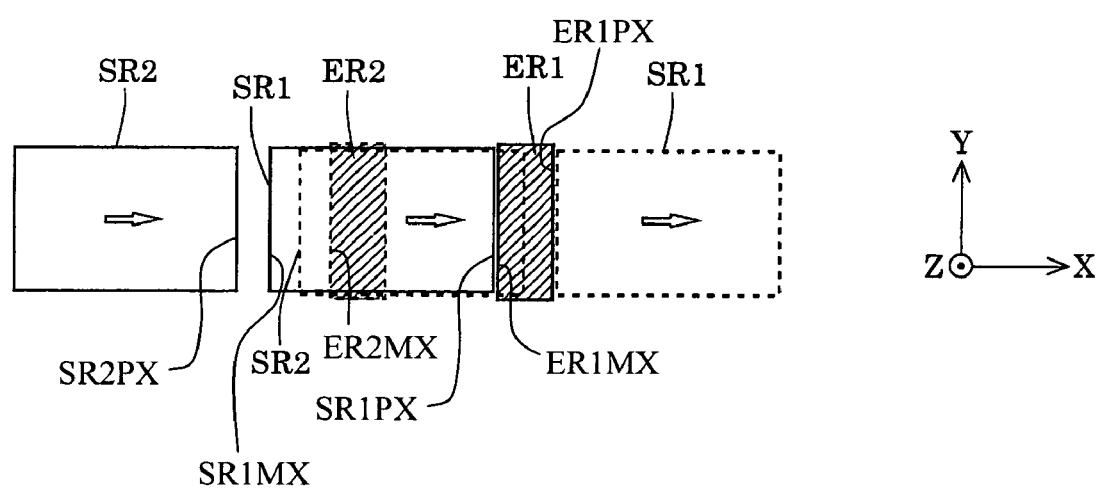
FIG. 15 shows positional relationships between projection areas and shot areas at the start time point and the end time point of the scanning exposure for the first shot area in the second embodiment.

Subsequently, as shown by broken lines in FIG. 14, the scanning exposure for the first shot area SR1 is completed at the point in time at which the edge PAMX on the side in the −X direction of the pattern area PA is moved to the edge IR1PX on the side in the +X direction of the first illumination area IR1. At the time point at which the scanning exposure for the first shot area SR1 is completed, as shown by broken lines in FIG. 15, the edge SR1MX on the side in the −X direction of the first shot area SR1 is coincident with the edge ER1PX on the side in the +X direction of the first projection area ER1.

However, the second illumination area IR2 (as well as the second projection area ER2) is not formed in accordance with the action of the mask blind MB2 included in the second illumination system IL2 until at least the edge SR1MX on the side in the −X direction of the first shot area SR1 goes past (passes through) the edge ER2MX on the side in the −X direction of the second projection area ER2 in the reference state so that the first shot area SR1 is not affected by the second projection area ER2 when the scanning exposure is performed for the first shot area SR1. In other words, the illumination systems IL1, IL2 successively form the first illumination area IR1 (as well as the first projection area ER1) and the second illumination area IR2 (as well as the second projection area ER2).

Further, the size of the first illumination area IR1 in the X direction (as well as the first projection area ER1) is gradually decreased from the predetermined value in the reference state to zero in accordance with the action of the mask blind MB1 included in the first illumination system IL1 so that the following second shot area SR2 is not affected by the first projection area ER1 during the scanning exposure for the first shot area SR1. Specifically, the size in the X direction of the first illumination area IR1 (as well as the first projection area ER1) starts to be decreased at the point in time at which the edge SR1MX on the side in the −X direction of the first shot area SR1 goes past the edge ER1MX on the side in the −X direction of the first projection area ER1; and the size in the X direction of the first illumination area IR1 (as well as the first projection area ER1) is decreased to zero so that the second shot area SR2 is not affected by the first projection area ER1.

Figure 16:
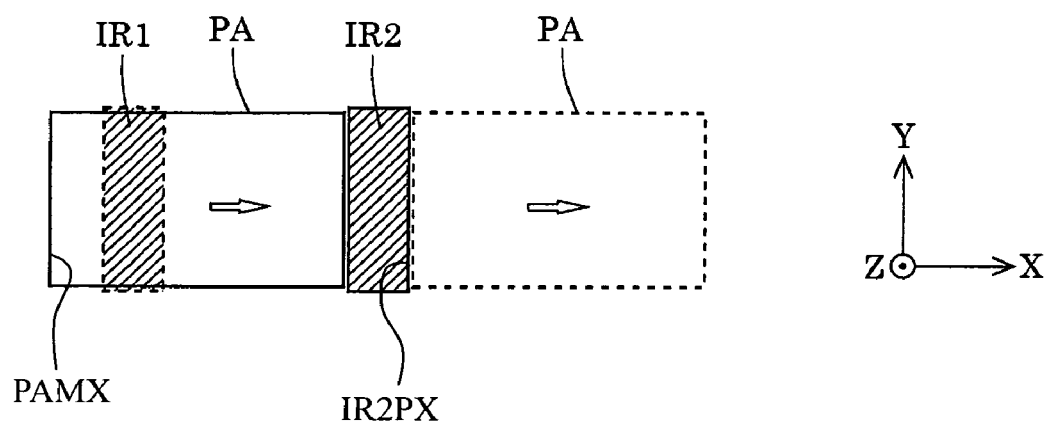
FIG. 16 shows positional relationships between the illumination areas and the pattern area at a start time point and an end time point of the scanning exposure for the second shot area in the second embodiment.
Figure 17:
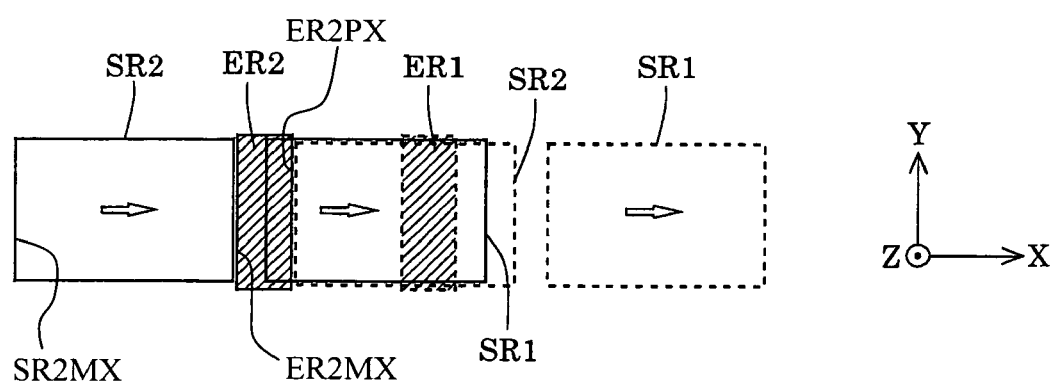
FIG. 17 shows positional relationships between the projection areas and the shot areas at the start time point and the end time point of the scanning exposure for the second shot area in the second embodiment.

The scanning exposure for the second shot area SR2 is started at the point in time at which the mask stage MS is further moved in the +X direction and the edge PAPX on the side in the +X direction of the pattern area PA is coincident with the edge IR2MX on the side in the −X direction of the second illumination area IR2 as depicted by solid lines in FIG. 16. At the time point at which the scanning exposure is started for the second shot area SR2, the edge SR2PX on the side in the +X direction of the second shot area SR2 is coincident with the edge ER2MX on the side in the −X direction of the second projection area ER2, as depicted by solid lines in FIG. 17. However, prior to the start of the scanning exposure for the second shot area SR2, the size in the X direction of the second illumination area IR2 (as well as the second projection area ER2) is gradually increased from zero to the predetermined value in the reference state in accordance with the action of the mask blind MB2 while preventing the first shot area SR1 from being affected by the second projection area ER2.

Subsequently, as depicted by broken lines in FIG. 16, the scanning exposure for the second shot area SR2 is completed at the point in time at which the edge PAMX on the side in the −X direction of the pattern area PA is moved to the edge IR2PX on the side in the +X direction of the second illumination area IR2. At the time point at which the scanning exposure is completed for the second shot area SR2, the edge SR2MX on the side in the −X direction of the second shot area SR2 is coincident with the edge ER2PX on the side in the +X direction of the second projection area ER2, as depicted by broken lines in FIG. 17.

The size in the X direction of the second illumination area IR2 (as well as the second projection area ER2) is gradually decreased from the predetermined value in the reference state to zero in accordance with the action of the mask blind MB2 included in the second illumination system IL2 so that the following third shot area (not shown) is not affected by the second projection area ER2 during or after the completion of the scanning exposure for the second shot area SR2. Specifically, the size in the X direction of the second illumination area IR2 (as well as the second projection area ER2) starts to be decreased at the point in time at which the edge SR2MX on the side in the −X direction of the second shot area SR2 goes past the edge ER2MX on the side in the −X direction of the second projection area ER2; and the size in the X direction of the second illumination area IR2 (as well as the second projection area ER2) is decreased to zero so that the third shot area is not affected by the second projection area ER2.

Figure 18:
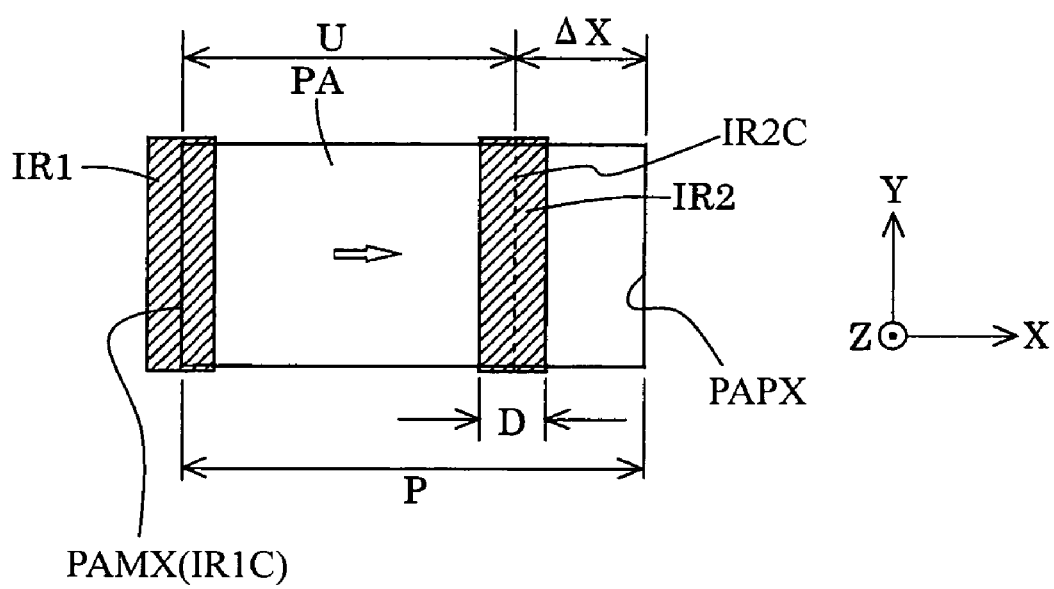
FIG. 18 is a first drawing illustrating a condition required to continuously perform the scanning exposure for two adjacent shot areas in the second embodiment.
Figure 19:
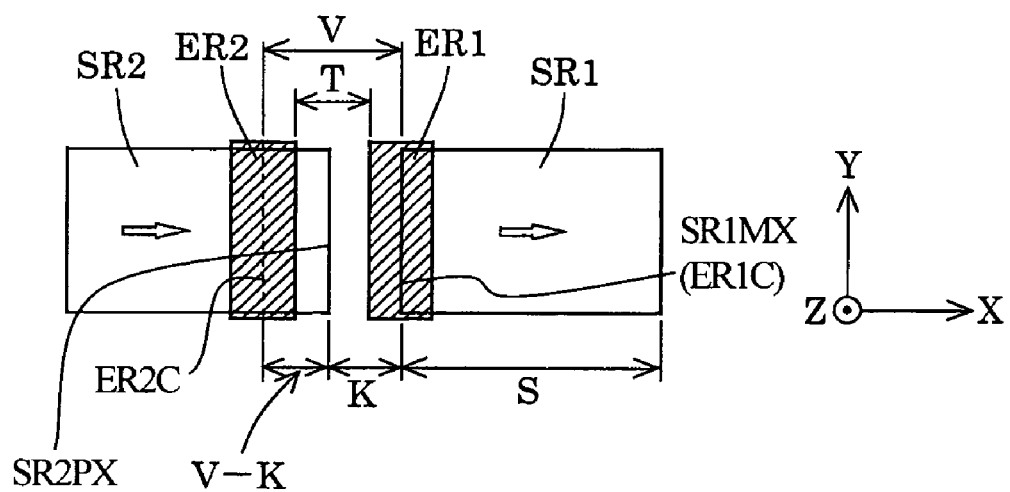
FIG. 19 is a second drawing illustrating the condition required to continuously perform the scanning exposure for the two adjacent shot areas in the second embodiment.

Next, an explanation will be made with reference to FIGS. 18 and 19 about the condition required to perform the scanning exposure continuously for the two adjacent shot areas SR1, SR2 in the second embodiment. In order to simplify the explanation, FIG. 18 shows a state that the edge PAMX on the side in the −X direction of the pattern area PA arrives at the center IR1C of the first illumination area IR1. FIG. 19 shows a state that the edge SR1MX on the side in the −X direction of the first shot area SR1 arrives at the center ER1C of the first projection area ER1 corresponding to FIG. 18.

With reference to FIG. 18, reference symbol "U" indicates the center-to-center spacing distance in the X direction between the center IR1C of the first illumination area IR1 and the center IR2C of the second illumination area IR2. Reference symbol "P" indicates the size in the X direction of the pattern area PA, and reference symbol "D" indicates the size in the X direction of each of the first illumination area IR1 and the second illumination area IR2. Reference symbol "AX" indicates the distance in the X direction between the edge PAPX on the side in the +X direction of the pattern area PA and the center IR2C of the second illumination area IR2 in the state shown in FIG. 18.

With reference to FIG. 19, reference symbol "S" indicates the size in the X direction of each of the first shot area SR1 and the second shot area SR2, and reference symbol "K" indicates the spacing distance in the X direction between the first shot area SR1 and the second shot area SR2. Reference symbol "V" indicates the center-to-center spacing distance in the X direction between the center ER1C of the first projection area ER1 and the center ER2C of the second projection area ER2, and reference symbol "T" indicates the spacing distance in the X direction between the first projection area ER1 and the second projection area ER2.

In this case, the relationships hold as shown by the following expressions (5) to (8).

$$U = P - \Delta X \quad (5)$$

$$P = S/\beta \quad (6)$$

$$\Delta X = (V-K)/\beta \quad (7)$$

$$V = \beta \times D + T \quad (8)$$

Here, the expressions (5), (6) and (8) define the relationship derived from the distance in the X direction between the first illumination area IR1 and the second illumination area IR2, the length (width) in the X direction of each of the first illumination area IR1 and the second illumination area IR2, the length in the X direction of the pattern area PA, the distance in the X direction between the first projection area ER1 and the second projection area ER2 and the length (width) in the X direction of each of the first projection area ER1 and the second projection area ER2. The expression (7) shows the relationship among the length in the X direction of each of the first shot area SR1 and the second shot area SR2, the length in the X direction of the pattern area PA and the spacing distance in the X direction between the first shot area SR1 and the second shot area SR2 with respect to the projection magnification $\beta$, etc, and the expression (7) defines the following condition. That is, in the arrangements shown in FIGS. 18 and 19, the edge PAPX on the side in the +X direction of the pattern PA should already arrive at the center IR2C of the second illumination area IR2 before the pattern area PA passes through the first illumination area IR1 and the scanning exposure for the first shot area SR1 by the first projection area ER1 is completed. When the edge PAPX on the side in the +X direction of the pattern PA arrives at the center IR2C of the second illumination area IR2, it is necessary that the edge SR2PX on the side in the +X direction of the second illumination area IR2 is positioned at the center ER2C of the second projection area ER2. Namely, in order that the image of the pattern PA is correctly transferred onto the second shot area SR2, the second shot area SR2 and the pattern PA should be aligned with respect to each other. Accordingly, while the pattern PA on the mask M is moved by AX shown in FIG. 18, the second shot area SR2 on the wafer W is moved by V-K shown in FIG. 18. Therefore, when the projection magnification $\beta$ is considered, the relationship of $\Delta X = (V-K)/P$ is determined.

The following conditional expressions (D), (E), (F) are obtained from the relationships expressed in the expressions (5) to (8). The conditional expressions (D), (E), (F) differ only in the expression forms. When one conditional expression of the conditional expressions is satisfied, the other two conditional expressions are also satisfied.

$$U=(S+K-V)/\beta \quad (D)$$

$$U=P+(K-V)/\beta \quad (E)$$

$$U=P-D-(T-K)/\beta \quad (F)$$

As described above, the second embodiment is constructed so that the center-to-center spacing distance U in the X direction, which is provided between the center IR1C of the first illumination area IR1 as the first conjugate area optically conjugate with the first projection area ER1 via the projection optical system PL and the center IR2C of the second illumination area IR2 as the second conjugate area optically conjugate with the second projection area ER2 via the projection optical system PL, satisfies the conditional expression (D) as well as the conditional expressions (E), (F). With this, the scanning exposure can be continuously performed for the two shot areas SR1, SR2 which are adjacent to each other (which are different) in the X direction, by performing the synchronous movement in the X direction of the mask stage MS and the wafer stage WS once (synchronous movement including no step movement in the Y direction). As a result, also in the exposure apparatus of the second embodiment, the scanning exposure can be continuously performed for the two adjacent shot areas in the same manner as in the first embodiment. Therefore, it is possible to achieve the improvement in the throughput in relation to the scanning exposure based on, for example, the simple scanning procedure as shown in FIG. 10. In the second embodiment, the center-to-center spacing distance U in the X direction between the pair of conjugate areas is smaller than that in the first embodiment. Therefore, it is easy to integrate the illumination systems IL1, IL2 into one unit.

Figure 20:
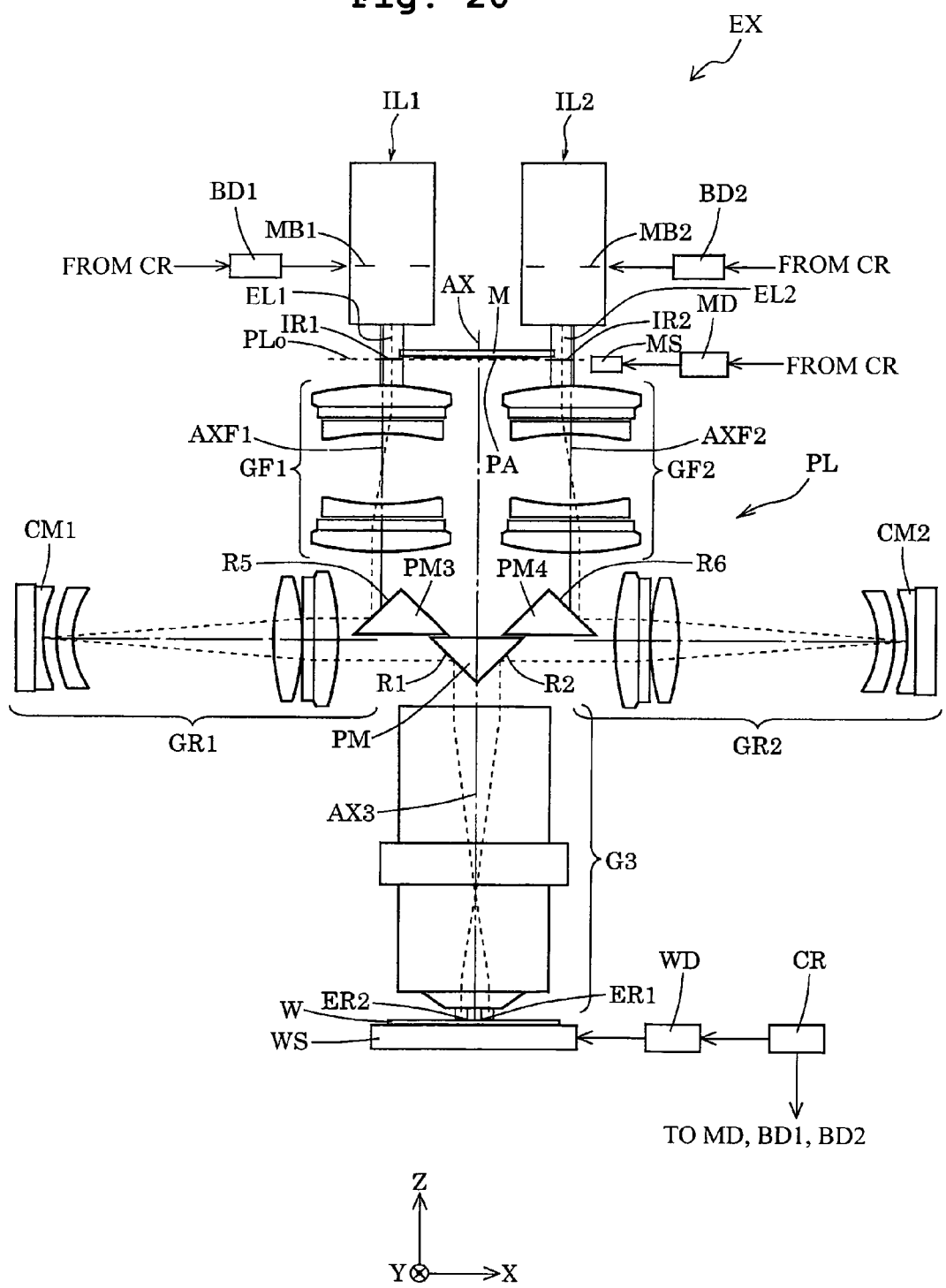
FIG. 20 shows a construction of an exposure apparatus according to a modification of the second embodiment.

FIG. 20 shows the construction of an exposure apparatus according to a modification of the second embodiment. In the second embodiment shown in FIG. 13, the center of the first illumination area IR1 and the optical axis AXF1 of the first front side imaging system GF1 are substantially coincident with each other, and the center of the second illumination area IR2 and the optical axis AXF2 of the second front side imaging system GF2 are substantially coincident with each other. On the other hand, in the modification shown in FIG. 20, the center of the first illumination area IR1 is eccentrically positioned in the +X direction from the optical axis AXF1, and the center of the second illumination area IR2 is eccentrically positioned in the −X direction from the optical axis AXF2. In other words, the center of the first illumination area IR1 and the center of the second illumination area IR2 are eccentrically positioned inwardly toward the reference optical axis AX. Owing to this construction, it is easy to arrange the first front side imaging system GF1 and the second front side imaging system GF2 without allowing them to mechanically interfere with each other.

Figure 21:
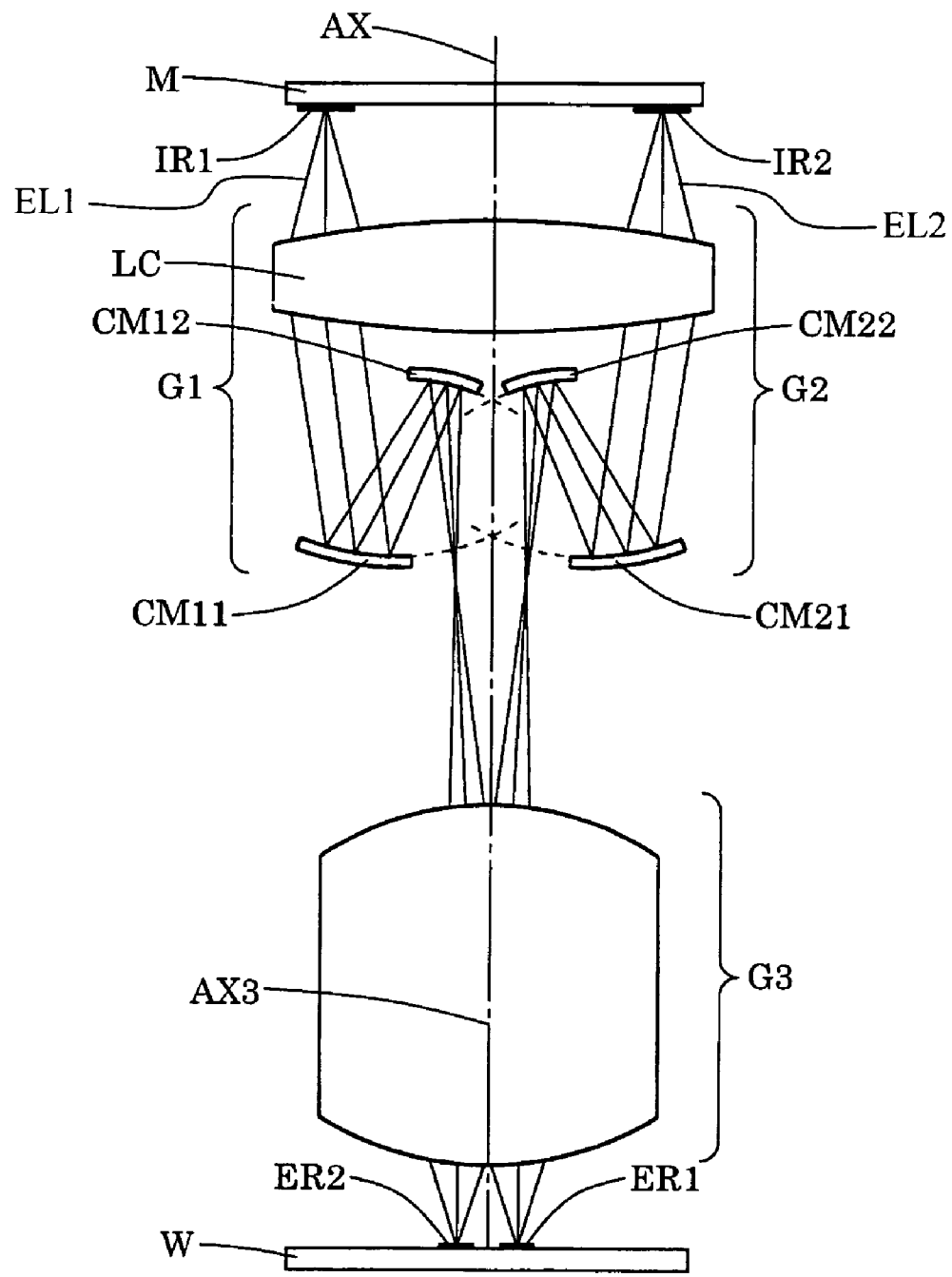
FIG. 21 shows an example of a catadioptric optical system applicable to the second embodiment, wherein all transmissive optical members are coaxially arranged.
Figure 22:
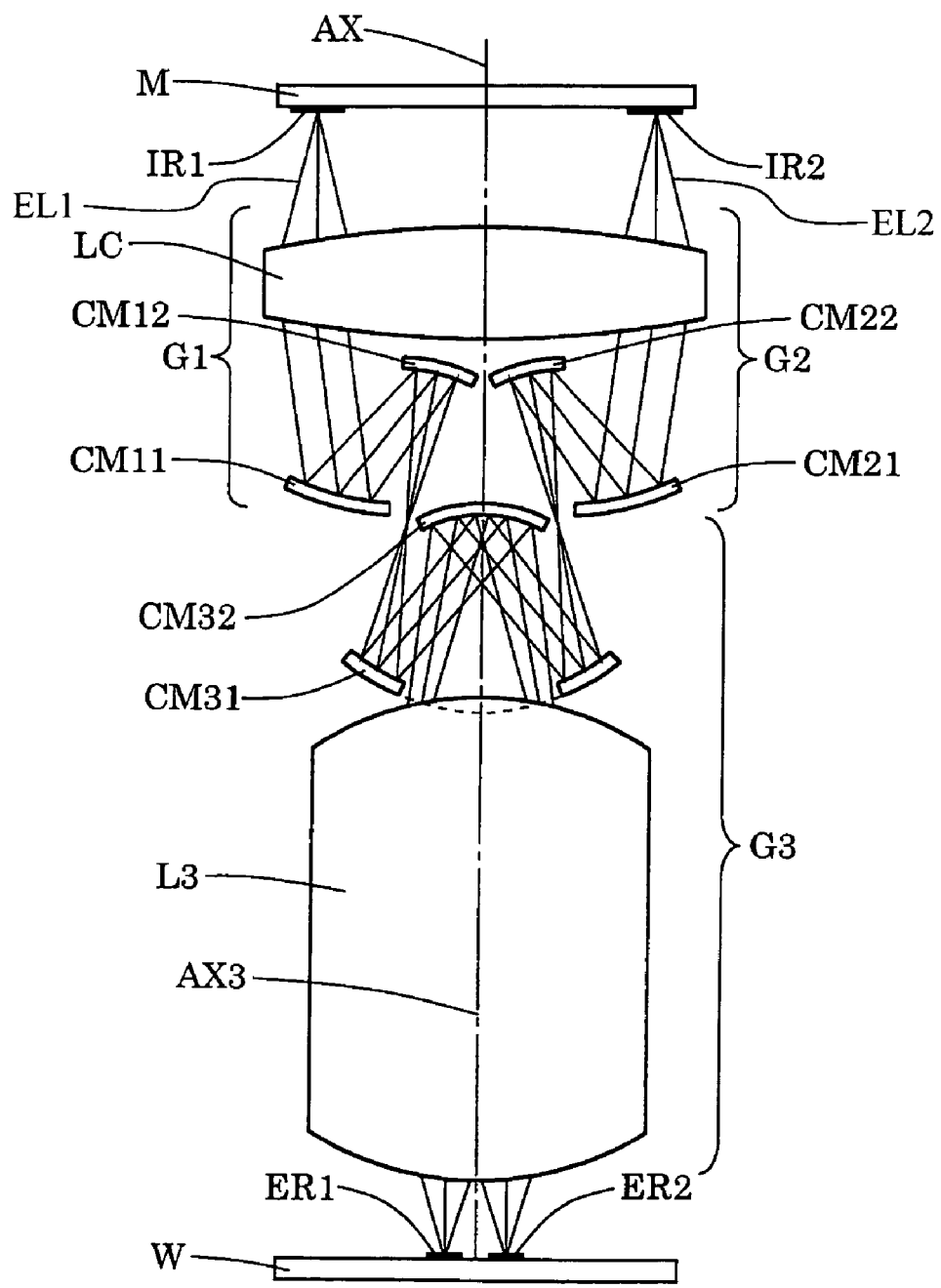
FIG. 22 shows another example of a catadioptric optical system applicable to the second embodiment, wherein all transmissive optical members are coaxially arranged.

In the second embodiment, the three-times imaging type catadioptric optical system, which includes the lenses (transmissive optical members) eccentrically arranged with respect to the reference optical axis AX as shown in FIG. 13, is used as the projection optical system for forming the mask pattern images (projected images) erected in the X direction. However, there is no limitation to this. As shown in FIGS. 21 and 22, for example, a catadioptric optical system, in which all transmissive optical members are coaxially arranged along with the reference optical axis AX, can be also applied to the projection optical system of the second embodiment.

A catadioptric optical system shown in FIG. 21 includes a first imaging system G1 which forms a first intermediate image of the pattern of the mask M illuminated in a first illumination system IL1, a second imaging system G2 which forms a second intermediate image of the pattern illuminated in a second illumination system IL2, and a third imaging system G3 which forms a projected image of the pattern in a first projection area ER1 based on the first intermediate image and which forms a projected image of the pattern in a second projection area ER2 based on the second intermediate image. The third imaging system G3 is a dioptric optical system, and its optical axis AX3 is coincident with the reference optical axis AX.

The first imaging system G1 and the second imaging system G2 are mutually constructed in the same manner, and are catadioptric optical systems provided symmetrically in relation to the YZ plane including the optical axis AX3 of the third imaging system G3 (as well as the reference optical axis AX). Specifically, the first imaging system G1 (second imaging system G2) is provided with a positive lens group LC which is common to the first imaging system G1 and the second imaging system G2, a concave reflecting mirror CM11 (CM21), and a concave reflecting mirror CM12 (CM22) as referred to in an order of the incidence of the light. In this case, the positive lens group LC is arranged along with the reference optical axis AX. However, the concave reflecting mirrors CM11 (CM21), CM12 (CM22) are arranged eccentrically with respect to the reference optical axis AX.

In the catadioptric optical system shown in FIG. 21, a light EL1, which comes from the pattern illuminated in the first illumination area IR1, forms the first intermediate image via the positive lens group LC, the concave reflecting mirror CM11, and the concave reflecting mirror CM12. The first intermediate image is an image inverted in the X direction and the Y direction. The light, which comes from the first intermediate image, passes through the third imaging system G3 to form the projected image of the pattern in the first projection area ER1 on the wafer W. The first projected image is, for example, a reduction image of about ¼ of the mask pattern, and the image is erected in the X direction and the Y direction.

Similarly, a light EL2, which comes from the pattern illuminated in the second illumination area IR2, forms the second intermediate image via the positive lens group LC, the concave reflecting mirror CM21, and the concave reflecting mirror CM22. The second intermediate image is an image inverted in the X direction and the Y direction in the same manner as the first intermediate image. The light, which comes from the second intermediate image, passes through the third imaging system G3 to form the projected image of the pattern in the second projection area ER2 on the wafer W. The second projected image is, for example, a reduction image of about ¼ of the mask pattern, and the image is erected in the X direction and the Y direction in the same manner as the first projected image.

A catadioptric optical system shown in FIG. 22 has a construction similar to that of the catadioptric optical system shown in FIG. 21. However, in the catadioptric optical system shown in FIG. 21, the third imaging system G3 is the dioptric optical system. On the other hand, in the catadioptric optical system shown in FIG. 22, the third imaging system G3 is a catadioptric optical system. The positional relationship in the X direction between the first projection area ER1 and the second projection area ER2 formed on the wafer W, which is provided in the catadioptric optical system shown in FIG. 21, is reverse to that provided in the catadioptric optical system shown in FIG. 22.

Specifically, in the in the catadioptric optical system shown in FIG. 22, the third imaging system G3 is provided with a concave reflecting mirror CM31 which has a central opening formed about the center of the reference optical axis AX, a concave reflecting mirror CM32, and a positive lens group L3 as referred to in an order of the incidence of the light. In this case, the concave reflecting mirror CM31, the concave reflecting mirror CM32, and the positive lens group L3 are arranged along with the reference optical axis AX (optical axis AX3) without being positioned eccentrically.

In the catadioptric optical system shown in FIG. 22, a light EL1, which comes from the pattern illuminated in the first illumination area IR1, forms the first intermediate image via the positive lens group LC, the concave reflecting mirror CM11, and the concave reflecting mirror CM12. The first intermediate image is an image inverted in the X direction and the Y direction. The light, which comes from the first intermediate image, passes along the concave reflecting mirror CM31, the concave reflecting mirror CM32, and the positive lens group L3 to form the projected image of the pattern in the first projection area ER1 on the wafer W. The first projected image is, for example, a reduction image of about ¼ of the mask pattern, and the image is erected in the X direction and the Y direction.

Similarly, a light EL2, which comes from the pattern illuminated in the second illumination area IR2, forms the second intermediate image via the positive lens group LC, the concave reflecting mirror CM21, and the concave reflecting mirror CM22. The second intermediate image is an image inverted in the X direction and the Y direction in the same manner as the first intermediate image. The light, which comes from the second intermediate image, passes along the concave reflecting mirror CM31, the concave reflecting mirror CM32, and the positive lens group L3 to form the projected image of the pattern in the second projection area ER2 on the wafer W. The second projected image is, for example, a reduction image of about ¼ of the mask pattern, and the image is erected in the X direction and the Y direction in the same manner as the first projected image.

In each of the catadioptric optical systems shown in FIGS. 21 and 22, a lens group (broad concept including one lens), which is common to the first imaging system G1 and the second imaging system G2, can be arranged along with the reference optical axis AX in the optical paths between the concave reflecting mirrors CM11, CM21 and the concave reflecting mirrors CM12, CM22.

In the respective embodiments described above, the shape of the illumination area (IR1, IR2) formed on the object plane PLo of the projection optical system PL is defined, and the shape of the projection area (ER1, ER2) formed on the wafer W is consequently defined, in accordance with the action of the movable field diaphragm (MB1, MB2) arranged on the pattern conjugate plane optically conjugate with the pattern surface of the mask M in the optical path of the illumination system (IL1, IL2; IL). However, there is no limitation to this. For example, it is also allowable to arrange a movable field diaphragm on the pattern conjugate plane (position at which the intermediate image is formed) optically conjugate with the pattern surface of the mask in the optical path of the projection optical system so as to define the shape of the projection area formed on the photosensitive substrate. In this case, the illumination area is not necessarily coincident with the conjugate area optically conjugate with the projection area. Therefore, the conjugate area is used in place of the illumination area in the respective conditional expressions. Alternatively, the following interpretation may be allowable. That is, the illumination area is not an area in which the light flux coming from the illumination system arrives at the object plane of the projection optical system, but the illumination area is an area in which the effective light flux to arrive at the photosensitive substrate via the projection optical system from the illumination system, passes through the object plane of the projection optical system, i.e., the conjugate area. There is no limitation to the field diaphragm mechanism which is mechanically driven (moved). Those usable as the movable field diaphragm include, for example, an element such as a liquid crystal filter in which the light/dark areas can be electrically changed.

In the respective embodiments described above, such a situation is assumed that at least one of the size S in the X direction of each of the shot areas and the spacing distance K in the X direction between the respective shot areas is changed. In this case, it is necessary that any optical adjustment should be performed so that the center-to-center spacing distance U in the X direction, which is provided between the center of the first conjugate area (first illumination area IR1 in the embodiment) and the center of the second conjugate area (second illumination area IR2 in the embodiment), satisfies the required conditional expression or expressions. For example, it is considered in the first embodiment that the spacing distance T in the X direction between the first projection area and the second projection area is changed, for example, by the optical adjustment in relation to at least one of the imaging systems G1, G2 and the deflecting member PM, and the center-to-center spacing distance U between the pair of conjugate areas is consequently changed to have the required value.

In the respective embodiments, the mask blinds MB1, MB2 are operated so as to prevent the first shot area SR1 (or the second shot area SR2) from being exposed by the second projection area ER2 (or the first projection area ER1). Instead of this, it is allowable to perform the on/off control for the illumination systems IL1, IL2 such that the illumination area IR1 or the illumination area IR2 is not illuminated. In this case, the mask blinds MB1, MB2 can be omitted.

The exposure apparatus of each of the embodiments described above is produced by assembling the various subsystems including the respective constitutive elements as defined in claims so that the predetermined mechanical accuracy, electric accuracy and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which the temperature, the cleanness, etc. are managed.

Figure 24:
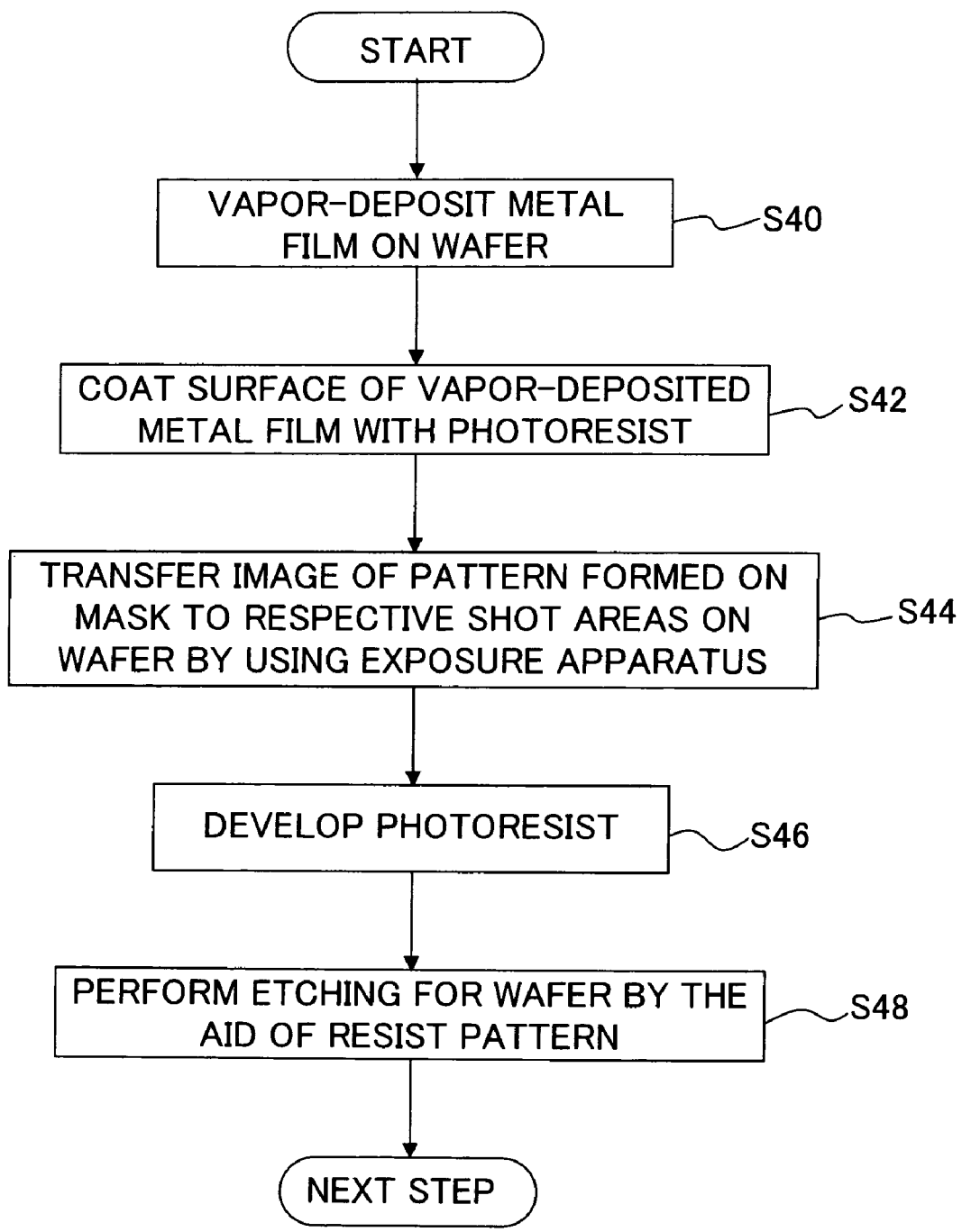
FIG. 24 is a flow chart illustrating steps of producing a semiconductor device.

Next, an explanation will be made about a method for producing a device using the exposure apparatus or the exposure method according to the embodiment described above. FIG. 24 shows a flow chart illustrating steps of producing the semiconductor device. As shown in FIG. 24, in the steps of producing the semiconductor device, a metal film is vapor-deposited on a wafer W serving as a substrate of the semiconductor device (Step S40), and a surface of the vapor-deposited metal film is coated with a photoresist as a photosensitive material (Step S42). Subsequently, a pattern, which is formed on a mask M as shown in the flow chart of FIG. 23, is transferred to respective shot areas on the wafer W by using the exposure apparatus or the exposure method of the embodiment described above (Step S44: exposure step), and the development is performed for the wafer W for which the transfer has been completed, i.e., the development is performed for the photoresist onto which the pattern has been transferred (Step S46: development step)

After that, the processing such as the etching, etc. is performed for the surface of the wafer W by using the resist pattern as the mask for processing the wafer, the resist pattern having been formed on the surface of the wafer W in Step S46 (Step S48: processing step). The term "resist pattern" herein refers to the photoresist layer (transfer pattern layer) formed with protrusions and recesses having shapes corresponding to the pattern transferred by the exposure apparatus or the exposure method of the embodiment described above, wherein the recesses penetrate through the photoresist layer. In Step S48, the surface of the wafer W is processed via the resist pattern. The processing, which is performed in Step S48, includes, for example, at least one of the etching for the surface of the wafer W and the formation of the film such as the metal film. In Step S44, the exposure apparatus or the exposure method of the embodiment described above transfers the pattern by using the wafer W, on which the photoresist is coated, as the photosensitive substrate.

Figure 25:
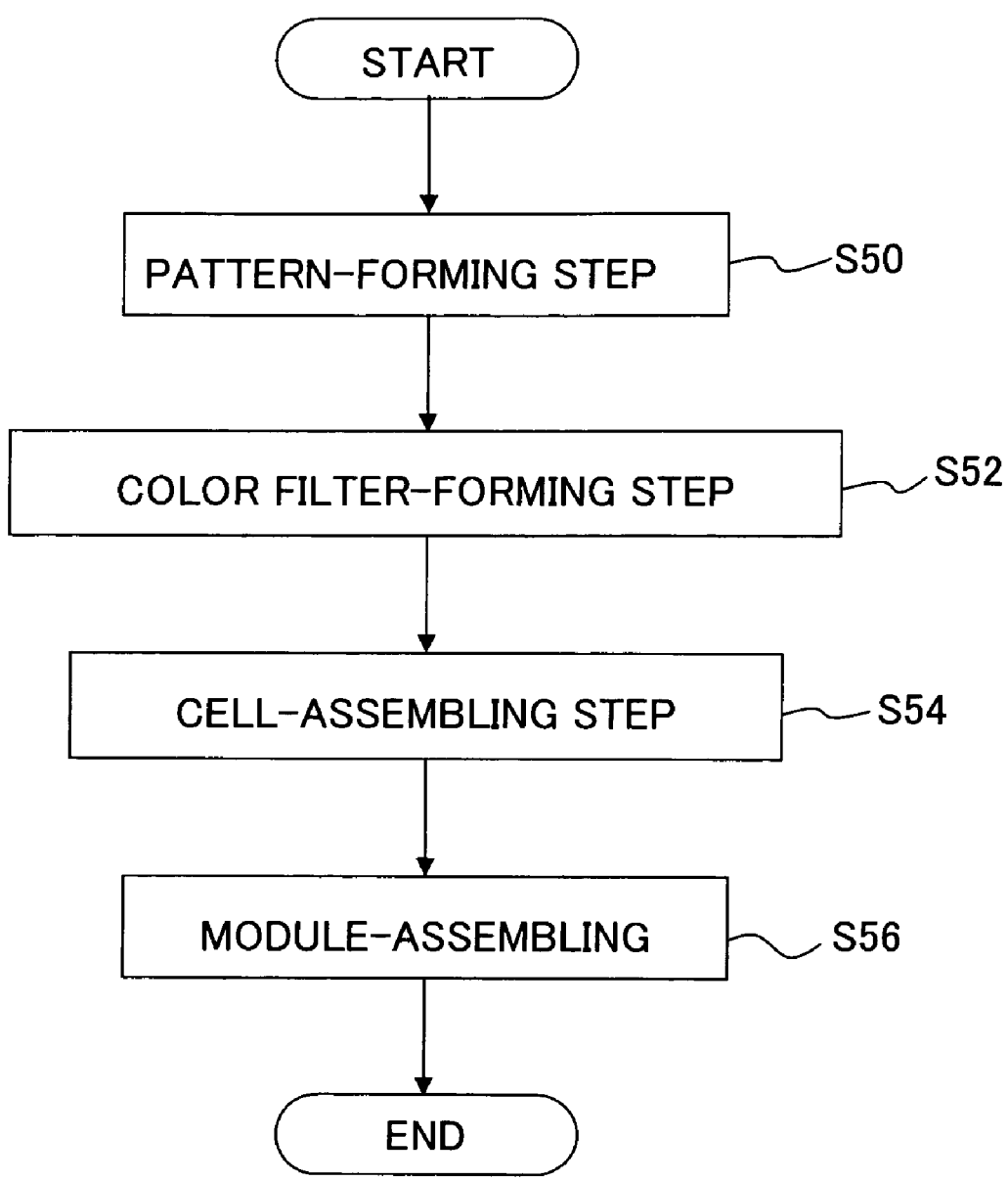
FIG. 25 is a flow chart illustrating steps of producing a liquid crystal device.

FIG. 25 shows a flow chart illustrating steps of producing a liquid crystal device such as a liquid crystal display element or the like. As shown in FIG. 25, in the steps of producing the liquid crystal device, a pattern-forming step (Step S50), a color filter-forming step (Step S52), a cell-assembling step (Step S54), and a module-assembling step (Step S56) are successively performed. In the pattern-forming step of Step S50, a predetermined pattern, which includes, for example, a circuit pattern and an electrode pattern, is formed on a glass substrate coated with a photoresist as a photosensitive substrate by using the exposure apparatus or the exposure method of the embodiment described above. The pattern-forming step includes an exposure step of transferring the pattern to a photoresist layer by using the exposure apparatus or the exposure method of the embodiment described above, a development step of performing the development of the photosensitive substrate to which the pattern has been transferred, i.e., the development of the photoresist layer on the glass substrate to form the photoresist layer (transfer pattern area) having the shape corresponding to the pattern, and a processing step of processing the surface of the glass substrate via the developed photoresist layer.

In the color filter-forming step of Step S52, a color filter is formed, in which a large number of sets of three dots corresponding to R (Red), G (Green), and B (Blue) are arranged in a matrix form, or a plurality of sets of filters of three stripe of R, G, and B are arranged in the horizontal scanning direction. In the cell-assembling step of Step S54, a liquid crystal panel (liquid crystal cell) is assembled by using the glass substrate formed with the predetermined pattern in Step S50 and the color filter formed in Step S52. Specifically, the liquid crystal panel is formed, for example, by injecting the liquid crystal into a space between the glass substrate and the color filter. In the module-assembling step of Step S56, various parts, which include a back light, an electronic circuit for performing the display operation of the liquid crystal panel, etc., are attached to the liquid crystal panel assembled in Step S54.

The present invention is not limited to the application to the exposure apparatus for producing the semiconductor device or the liquid crystal device. The present invention is also widely applicable, for example, to exposure apparatuses for display apparatuses including, for example, a plasma display as well as to exposure apparatuses for producing various devices including, for example, an image pickup device (CCD or the like), a micromachine, a thin film magnetic head, and a DNA chip. Further, the present invention is also applicable to the exposure step (exposure apparatus) adopted when masks (photomasks, reticles or the like) formed with mask patterns of various devices are produced by using the photolithography step.

In each of the embodiments as described above, it is allowable to adopt the liquid immersion method as disclosed, for example, in International Publication No. 1999/49504, Japanese Patent Application Laid-open No. 2004-289126 (corresponding to United States Patent Application Publication No. 2004/0165159), etc. Namely, it is allowable to form, by using a liquid immersion system, a liquid immersion area of a liquid on a substrate P (wafer W) such that the liquid immersion area covers the first and second projection areas ER1, ER2, and to irradiate the first and second exposure lights EL1, EL2 onto the substrate P through the liquid in the liquid immersion area. The liquid immersion system may be arranged, for example, in the vicinity of the optical paths of the exposure lights between a final optical element (end optical element) of the projection optical system PL and the substrate P, and the liquid immersion system may be provided with a liquid supply member having a supply port through which the liquid is supplied with respect to the optical paths and a liquid recovery member having a recovery port through which the liquid is recovered from the optical paths. Note that it is not necessarily indispensable that a part of the liquid immersion system (for example, the liquid supply member and/or the liquid recovery member) is provided on the exposure apparatus. It is allowable to substitutively use, for example, the equipment of the factory, etc. in which the exposure apparatus is installed. Further, the construction of the liquid immersion system is not limited to those described above, and it is allowable to use those as disclosed, for example, in European Patent Publication No. 1420298, International Publication No. 2004/055803, International Publication No. 2004/057590, International Publication No. 2005/029559 (corresponding to United States Patent Application Publication No. 2006/0231206), International Publication No. 2004/086468 (corresponding to United States Patent Application Publication No. 2005/0280791), Japanese Patent Application Laid-open No. 2004-289126 (corresponding to U.S. Pat. No. 6,952, 253), etc. As a liquid used in the liquid immersion method, it is allowable to use water (pure or purified water), and to use those other than water, for example, fluorine-based fluids such as fluorine-based oil and perfluoropolyether (PFPE), or cedar oil, etc.

Further, the present invention is also applicable to an exposure apparatus of the multi-stage type provided with a plurality of substrate stages as disclosed, for example, in Japanese Patent Application Laid-open No. 10-163099, Japanese Patent Application Laid-open No. 10-214783 (corresponding to U.S. Pat. Nos. 6,341,007, 6,400,441, 6,549,269 and 6,590, 634), Published Japanese Translation of PCT International Publication for Patent Application No. 2000-505958 (corresponding to U.S. Pat. No. 5,969,441), etc. Furthermore, the present invention is applicable also to an exposure apparatus including a substrate stage which holds the substrate and a measurement stage on which a measurement member (for example, a reference member formed with a reference mark and/or various photoelectronic sensors) is provided, as disclosed, for example, in Japanese Patent Application Laid-open No. 11-135400 (corresponding to International Publication No. 1999/23692) and Japanese Patent Application Laid-open No. 2000-164504 (corresponding to U.S. Pat. No. 6,897,963).

With respect to the various U.S. Patents and United States Patent Application Publications identified in the specification of this application, the contents of these United States Patents and United States Patent Application Publications are incorporated herein by reference within a range of permission of the domestic laws and ordinances of the state or country in which the present application is filed, in relation to those other than those having been specifically and explicitly incorporated herein by reference as well.

According to the present invention, the substrate (wafer) can be exposed with high efficiency. Accordingly, a device having a high-density and complicated pattern and used in a liquid crystal display element, micro machine, etc. can be produced with high throughput. Therefore, the present invention will remarkably contribute to the international development of the precision mechanical equipment industry including the semiconductor industry.

What is claimed is:

1. An exposure apparatus comprising:
   a mask-moving section which holds a mask formed with a pattern and which is movable in a first direction;
   an illumination system which irradiates an exposure light onto the mask held by the mask-moving section and which forms a first illumination area and a second illumination area separated from each other by a spacing distance in the first direction;
   a substrate-moving section which holds a photosensitive substrate and which is movable in a second direction corresponding to the first direction and in synchronization with the mask-moving section;
   a projection optical system which forms a first projected image of the pattern positioned in the first illumination area and a second projected image of the pattern positioned in the second illumination area, on the photosensitive substrate held by the substrate-moving section; and
   a restricting section which restricts the first projected image and the second projected image on the photosensitive substrate to be within a first projection area and a second projection area respectively on the photosensitive substrate;
   wherein an area-to-area spacing distance, in the first direction, between a first conjugate area optically conjugate with the first projection area via the projection optical system and a second conjugate area optically conjugate with the second projection area via the projection optical system is set to be such a spacing distance that scanning exposures with a whole of the pattern with respect to a first transfer area and a second transfer area provided adjacently in the second direction on the photosensitive substrate are successively performed corresponding to synchronous movement of the mask-moving section and the substrate-moving section, each of the first transfer area and the second transfer area corresponding to the whole of the pattern and the first and second transfer areas being exposed by one time of scanning exposure between a step movement and the next step movement.

2. The exposure apparatus according to claim 1, wherein the area-to-area spacing distance is set to be a spacing distance based on a size of the first transfer area or the second transfer area in the second direction, a spacing distance between the first projection area and the second projection area in the second direction, a spacing distance between the first transfer area and the second transfer area in the second direction, and a magnification of the projection optical system.

3. The exposure apparatus according to claim 2, wherein the following relationship holds among a center-to-center spacing distance U between a center of the first conjugate area and a center of the second conjugate area in the first direction, a size S of the first transfer area or the second transfer area in the second direction, a center-to-center spacing distance V between a center of the first projection area and a center of the second projection area in the second direction, a spacing distance K between the first transfer area and the second transfer area in the second direction, and an absolute value β of the projection magnification of the projection optical system:

$$U=(S+K+V)/\beta.$$

4. The exposure apparatus according to claim 3, wherein the substrate-moving section is moved in a direction directed from the first projection area to the second projection area in the second direction and in synchronization with movement of the mask-moving section in a direction directed from the first conjugate area to the second conjugate area in the first direction.

5. The exposure apparatus according to claim 2, wherein the following relationship holds among a center-to-center spacing distance U between a center of the first conjugate area and a center of the second conjugate area in the first direction, a size S of the first transfer area or the second transfer area in the second direction, a center-to-center spacing distance V between a center of the first projection area and a center of the second projection area in the second direction, a spacing distance K between the first transfer area and the second transfer area in the second direction, and an absolute value β of the projection magnification of the projection optical system:

$$U=(S+K-V)/\beta.$$

6. The exposure apparatus according to claim 5, wherein the substrate-moving section is moved in a direction directed from the second projection area to the first projection area in the second direction and in synchronization with movement of the mask-moving section in a direction directed from the first conjugate area to the second conjugate area in the first direction.

7. The exposure apparatus according to claim 1, wherein the following relationship holds among a center-to-center spacing distance U between a center of the first conjugate area and a center of the second conjugate area in the first direction, a size P of a pattern area formed with the pattern on the mask in the first direction, a center-to-center spacing distance V between a center of the first projection area and a center of the second projection area in the second direction, a spacing distance K between the first transfer area and the second transfer area in the second direction, and an absolute value β of a projection magnification of the projection optical system:

$$U=P+(K+V)/\beta.$$

8. The exposure apparatus according to claim 7, wherein the substrate-moving section is moved in a direction directed from the first projection area to the second projection area in the second direction and in synchronization with movement of the mask-moving section in a direction directed from the first conjugate area to the second conjugate area in the first direction.

9. The exposure apparatus according to claim 1, wherein the following relationship holds among a center-to-center spacing distance U between a center of the first illumination area and a center of the second illumination area in the first direction, a size P of a pattern area formed with the pattern on the mask in the first direction, a size D of the first illumination area or the second illumination area in the first direction, a spacing distance T between the first projection area and the second projection area in the second direction, a spacing distance K between the first transfer area and the second transfer area in the second direction, and an absolute value β of a projection magnification of the projection optical system:

$$U=P+D+(T+K)/\beta.$$

10. The exposure apparatus according to claim 9, wherein the substrate-moving section is moved in a direction directed from the first projection area to the second projection area in the second direction and in synchronization with movement of the mask-moving section in a direction directed from the first conjugate area to the second conjugate area in the first direction.

11. The exposure apparatus according to claim 1, wherein the following relationship holds among a center-to-center spacing distance U between a center of the first conjugate area and a center of the second conjugate area in the first direction, a size P of a pattern area formed with the pattern on the mask in the first direction, a center-to-center spacing distance V between a center of the first projection area and a center of the second projection area in the second direction, a spacing distance K between the first transfer area and the second transfer area in the second direction, and an absolute value β of a projection magnification of the projection optical system:

$$U=P+(K-V)/\beta.$$

12. The exposure apparatus according to claim 11, wherein the substrate-moving section is moved in a direction directed from the second projection area to the first projection area in the second direction and in synchronization with movement of the mask-moving section in a direction directed from the first conjugate area to the second conjugate area in the first direction.

13. The exposure apparatus according to claim 1, wherein the following relationship holds among a center-to-center spacing distance U between a center of the first illumination area and a center of the second illumination area in the first direction, a size P of a pattern area formed with the pattern on the mask in the first direction, a size D of the first illumination area or the second illumination area in the first direction, a spacing distance T between the first projection area and the second projection area in the second direction, a spacing distance K between the first transfer area and the second transfer area in the second direction, and an absolute value β of a projection magnification of the projection optical system:

$$U=P-D-(T-K)/\beta.$$

14. The exposure apparatus according to claim 13, wherein the substrate-moving section is moved in a direction directed from the second projection area to the first projection area in the second direction and in synchronization with movement of the mask-moving section in a direction directed from the first conjugate area to the second conjugate area in the first direction.

15. The exposure apparatus according to claim 1, wherein the restricting section sets a first size of the first projection area in the second direction and a second size of the second projection area in the second direction corresponding to synchronous movement of the mask-moving section and the substrate-moving section.

16. The exposure apparatus according to claim 15, wherein the restricting section sets the first size and the second size based on movement information corresponding to a movement position of the mask-moving section in the first direction and a movement position of the substrate-moving section in the second direction.

17. The exposure apparatus according to claim 16, wherein the restricting section includes a light-shielding member which is provided movably in a direction intersecting an optical path for the exposure light, and a shielding controller which sets a position of the light-shielding member with respect to the optical path for the exposure light based on the movement information.

18. The exposure apparatus according to claim 1, wherein the projection optical system includes a first imaging system which forms a first intermediate image of the pattern, a second imaging system which forms a second intermediate image of the pattern, and a third imaging system which forms the first projected image in the first projection area based on the first intermediate image and which forms the second projected image in the second projection area based on the second intermediate image.

19. The exposure apparatus according to claim 18, wherein the first imaging system and the second imaging system are catadioptric optical systems which are provided symmetrically in relation to an optical axis of the third imaging system.

20. The exposure apparatus according to claim 18, wherein the first imaging system has a first front side imaging system which forms a third intermediate image of the pattern, and a first rear side imaging system which forms the first intermediate image based on the third intermediate image; and
the second imaging system has a second front side imaging system which forms a fourth intermediate image of the pattern, and a second rear side imaging system which forms the second intermediate image based on the fourth intermediate image.

21. The exposure apparatus according to claim 20, wherein the first rear side imaging system and the second rear side imaging system are catadioptric optical systems which are provided symmetrically in relation to an optical axis of the third imaging system.

22. The exposure apparatus according to claim 1, wherein the illumination system has a first illumination optical system which forms the first illumination area based on a light from a first light source, and a second illumination optical system which forms the second illumination area based on a light from a second light source.

23. The exposure apparatus according to claim 22, wherein the first light source and the second light source have a light source in common to the first illumination optical system and the second illumination optical system.

24. The exposure apparatus according to claim 1, wherein the illumination system has a common illumination optical system which forms the first illumination area and the second illumination area based on a light from a common light source.

25. A method for producing a device, comprising:
transferring the pattern of the mask to the photosensitive substrate via the exposure apparatus as defined in claim 1; and processing the photosensitive substrate, to which the pattern has been transferred, based on the pattern.

26. An exposure apparatus which exposes a substrate with an image of a pattern formed on a mask, the exposure apparatus comprising:
   an illumination system which forms a first illumination area and a second illumination area, with a spacing distance, on a plane same as the mask;
   a mask-moving section which is movable continuously while holding the mask to make the pattern pass successively through the first illumination area and the second illumination area;
   a projection system which projects a first image and a second image on the substrate, the first image and the second image being formed when the pattern passes through the first illumination area and the second illumination area, respectively; and
   a substrate-moving section which is movable continuously, while holding the substrate, in a direction corresponding to movement of the mask-moving section and in synchronization with the movement of the mask-moving section to successively form an image of a whole of the pattern with the first image and the image of the whole of the pattern with the second image in different areas, respectively, on the substrate, by one time of scanning exposure between a step movement and the next step movement.

27. The exposure apparatus according to claim 26, further comprising a first blind and a second blind which restrict the first illumination area and the second illumination area when the first image and the second image are successively formed in the different areas on the substrate, respectively.

28. The exposure apparatus according to claim 27, wherein the different areas on the substrate are a first area and a second area in which the first image and the second image are formed respectively; and
   the first blind prevents the first image from being formed in the second area and the second blind prevents the second image from being formed in the first area.

29. A method for producing a device, comprising:
   transferring the pattern of the mask to the photosensitive substrate via the exposure apparatus as defined in claim 26; and
   processing the photosensitive substrate, to which the pattern has been transferred, based on the pattern.

30. An exposure method comprising:
   irradiating an exposure light onto a mask formed with a pattern to form a first illumination area and a second illumination area which are separated from each other by a spacing distance in a first direction;
   forming, on a photosensitive substrate, a first projected image of the pattern positioned in the first illumination area and a second projected image of the pattern positioned in the second illumination area; and
   synchronously moving the mask and the photosensitive substrate in the first direction and a second direction corresponding to the first direction respectively to successively perform scanning exposures with a whole of the pattern with respect to a first transfer area and a second transfer area, which are provided adjacently in the second direction on the photosensitive substrate, each of the first transfer area and the second transfer area corresponding to the whole of the pattern and the first and second transfer areas being exposed by one time of scanning exposure between a step movement and the next step movement.

31. The exposure method according to claim 30, wherein the successive scanning exposures with respect to the first and second transfer areas include moving the mask successively to a first area and a second area which are provided in the first illumination area and the second illumination area respectively while being separated from each other in the first direction by a spacing distance based on a size of the first transfer area or the second transfer area in the second direction, a spacing distance between the first projection area and the second projection area in the second direction, a spacing distance between the first transfer area and the second transfer area in the second direction, and a projection magnification of the projection optical system.

32. The exposure method according to claim 30, wherein the successive scanning exposures with respect to the first and second transfer areas include setting a first size of the first projected image in the second direction and a second size of the second projected image in the second direction on the photosensitive substrate, corresponding to synchronous movement of the mask and the photosensitive substrate.

33. The exposure method according to claim 32, wherein the setting of the first size and the second size includes setting the first size and the second size based on movement information corresponding to a movement position of the mask in the first direction and a movement position of the photosensitive substrate in the second direction.

34. The exposure method according to claim 33, wherein the setting of the first size and the second size includes setting a position of a light-shielding member, which shields the exposure light, with respect to an optical path for the exposure light based on the movement information.

35. A method for producing a device, comprising:
   using the exposure method as defined in claim 30 to transfer the pattern of the mask to the photosensitive substrate; and
   processing the photosensitive substrate, to which the pattern has been transferred, based on the pattern.

36. An exposure method for exposing a substrate with an image of a pattern formed on a mask, the exposure method comprising:
   forming a first illumination area and a second illumination area, with a spacing distance, on a plane same as the mask;
   moving the mask continuously relative to the first illumination area and the second illumination area to make the pattern pass successively through the first illumination area and the second illumination area;
   projecting a first image and a second image on the substrate, the first image and the second image being formed when the pattern passes through the first illumination area and the second illumination area, respectively; and
   moving the substrate continuously in a direction corresponding to movement of the mask and in synchronization with the movement of the mask to successively form an image of a whole of the pattern with the first image and the image of the whole of the pattern with the second image in different areas, respectively, on the substrate, by one time of scanning exposure between a step movement and the next step movement.

37. The exposure method according to claim 36, wherein the first illumination area and the second illumination area are aligned in a first direction; and
   a width in the first direction of each of the first and second illumination areas is smaller than a width in the first direction of the pattern.

38. The exposure method according to claim 36, further comprising moving the substrate in a different direction, different from the direction in which the substrate is successively moved, after the first image and the second image are successively formed in the different areas respectively on the substrate, and continuously moving the mask relative to the second illumination area and the first illumination area to make the pattern successively pass through the second illumination area and the first illumination area;

projecting, onto the substrate, a third image and a fourth image which are formed when the pattern passes through the second illumination area and the first illumination area respectively; and moving the substrate continuously in the direction corresponding to the movement of the mask and in synchronization with the movement of the mask to successively form the third image and the fourth image in different areas, respectively, on the substrate.

39. The exposure method according to claim 36, wherein the different areas on the substrate are a first area and a second area in which the first image and the second image are formed respectively; and when the first image and the second image are successively formed in the first area and the second area, respectively, on the substrate, the first illumination area is restricted so as to prevent the first image from being formed in the second area and the second illumination area is restricted so as to prevent the second image from being formed in the first area.

40. A method for producing a device, comprising:

using the exposure method as defined in claim 36 to transfer the pattern of the mask to the photosensitive substrate; and processing the photosensitive substrate, to which the pattern has been transferred, based on the pattern.

* * * * *